(12) United States Patent
Osako

(10) Patent No.: US 9,245,930 B2
(45) Date of Patent: Jan. 26, 2016

(54) METHOD OF MANUFACTURING DISPLAY PANEL

(75) Inventor: Takashi Osako, Kyoto (JP)

(73) Assignee: JOLED INC., Tokyo (JP)

( * ) Notice: Subject to any disclaimer, the term of this patent is extended or adjusted under 35 U.S.C. 154(b) by 143 days.

(21) Appl. No.: 14/131,788

(22) PCT Filed: Aug. 30, 2012

(86) PCT No.: PCT/JP2012/005502
§ 371 (c)(1),
(2), (4) Date: Jan. 9, 2014

(87) PCT Pub. No.: WO2013/031230
PCT Pub. Date: Mar. 7, 2013

(65) Prior Publication Data
US 2014/0141558 A1 May 22, 2014

(30) Foreign Application Priority Data

Sep. 2, 2011 (JP) ................. 2011-192059

(51) Int. Cl.
| | | |
|---|---|---|
| *H01L 27/32* | (2006.01) | |
| *H05B 33/10* | (2006.01) | |
| *G03F 1/42* | (2012.01) | |
| *G03F 7/20* | (2006.01) | |
| *G09F 9/30* | (2006.01) | |

(Continued)

(52) U.S. Cl.
CPC ............. *H01L 27/3206* (2013.01); *G03F 1/42* (2013.01); *G09F 3/204* (2013.01); *G09F 9/30* (2013.01); *H01L 21/027* (2013.01); *H01L 27/3211* (2013.01); *H01L 27/3283* (2013.01); *H01L 51/0011* (2013.01)

(58) Field of Classification Search
CPC ... G03F 1/42; H01L 27/3206; H01L 51/0011; H01L 27/3283; G09F 3/204
See application file for complete search history.

(56) References Cited

U.S. PATENT DOCUMENTS 5,795,686 A 8/1998 Takizawa et al.
6,146,796 A * 11/2000 Kim ................................ 430/30

(Continued)

FOREIGN PATENT DOCUMENTS

JP 9-236930 9/1997
JP 2000-066235 3/2000

(Continued)

OTHER PUBLICATIONS

Office Action from Japan Patent Office (JPO) in Japanese Patent Application No. 2011-192059, dated May 26, 2015.

(Continued)

*Primary Examiner* — Mary Wilczewski
*Assistant Examiner* — Erik T Peterson
(74) *Attorney, Agent, or Firm* — Greenblum & Bernstein, P.L.C.

(57) ABSTRACT

A method of manufacturing a display panel includes: a first step of forming a partition wall layer above a substrate; a second step of exposing the partition wall layer using a first photomask that has a mask pattern corresponding to a blue opening; a third step of exposing the partition wall layer using a second photomask that has a mask pattern corresponding to a red opening and a green opening; a fourth step of forming a partition wall by removing the partition wall layer to form the red opening, the green opening, and the blue opening in the partition wall layer; and a fifth step of forming a light emitting layer in each opening.

11 Claims, 17 Drawing Sheets

(51) Int. Cl.
*H01L 21/027* (2006.01)
*H01L 51/50* (2006.01)
*H05B 33/12* (2006.01)
*H05B 33/22* (2006.01)
*G09F 3/20* (2006.01)
*H01L 51/00* (2006.01)

(56) References Cited

U.S. PATENT DOCUMENTS

| | | |
|---|---|---|
| 6,504,581 B1 | 1/2003 | Hirosue et al. |
| 6,653,177 B2 | 11/2003 | Takizawa |
| 7,136,122 B2 | 11/2006 | Tak |
| 7,274,039 B2 | 9/2007 | Park |
| 7,352,431 B2 | 4/2008 | Tak |
| 7,767,369 B2 * | 8/2010 | Lin et al. ............ 430/5 |
| 8,134,668 B2 | 3/2012 | Nakagawa |
| 8,212,267 B2 | 7/2012 | Oosako |
| 2002/0039841 A1 | 4/2002 | Takizawa |
| 2004/0248020 A1 * | 12/2004 | Fujikawa et al. ............ 430/22 |
| 2005/0018111 A1 | 1/2005 | Tak |
| 2005/0024622 A1 * | 2/2005 | Kim ............ 355/75 |
| 2005/0074708 A1 * | 4/2005 | Saluel et al. ............ 430/394 |
| 2005/0142977 A1 | 6/2005 | Park |
| 2006/0057788 A1 * | 3/2006 | Shin et al. ............ 438/160 |
| 2006/0088790 A1 | 4/2006 | Moon et al. |
| 2007/0052888 A1 | 3/2007 | Tak |
| 2010/0085524 A1 | 4/2010 | Nakagawa |
| 2013/0153936 A1 | 6/2013 | Nishiyama |
| 2013/0187177 A1 | 7/2013 | Nanai et al. |

FOREIGN PATENT DOCUMENTS

| | | |
|---|---|---|
| JP | 2000-180894 | 6/2000 |
| JP | 2002-107905 | 4/2002 |
| JP | 2003-322864 | 11/2003 |
| JP | 2005-043898 | 2/2005 |
| JP | 2005-197256 | 7/2005 |
| JP | 2006-047877 | 2/2006 |
| WO | 2008/108032 | 9/2008 |
| WO | 2009/037965 | 3/2009 |

OTHER PUBLICATIONS

International Search Report (ISR) in International Patent Application No. PCT/JP2012/005502, dated Nov. 27, 2012.

* cited by examiner

METHOD OF MANUFACTURING DISPLAY PANEL

TECHNICAL FIELD

The present invention relates to a method of manufacturing a display panel, and particularly relates to a method of manufacturing an organic electroluminescence (EL) display panel including a partition wall in which a plurality of openings are formed.

BACKGROUND ART

In a display panel such as an organic EL display panel, a plurality of pixels arranged in a matrix constitute a display area. Each of the pixels is composed of subpixels corresponding to three colors red, green, and blue. The subpixels each include a light emitting layer of the corresponding color. The light emitting layers in the subpixels are separated from each other by a partition wall called "bank". The light emitting layers are each formed in a different one of openings of the partition wall, according to color. Examples of the partition wall include: a line bank for separating the plurality of subpixels on a column basis; and a pixel bank for separating the plurality of subpixels on a subpixel basis.

The partition wall is typically formed using a photosensitive resin. For example, a positive photosensitive resin or a negative photosensitive resin is applied onto a substrate, and exposed and developed using a photomask (reticle) having a predetermined mask pattern, thus forming the openings. The partition wall of the predetermined shape can be formed in this way.

Larger substrates are used in larger screens of display panels in recent years. This makes it difficult to form the partition wall of the predetermined shape in one operation using one photomask. In view of this, a method (division exposure) of dividing the area for forming the partition wall into a plurality of areas and exposing the plurality of areas using a plurality of photomasks corresponding to the plurality of areas has been proposed. Even in the case where the substrate is not large, division exposure may be needed depending on the type of exposure device.

A partition wall formation method by division exposure is described below, with reference to FIG. 16. FIG. 16 is a diagram for describing a conventional partition wall formation method by division exposure. (a) in FIG. 16 is a plan view of a typical display panel, and (b) in FIG. 16 is a partially enlarged view of a display area in the display panel.

As shown in (a) in FIG. 16, a plurality of pixels 1300 arranged in a matrix constitute a display area 1200 of a display panel 1100. When forming the partition wall in the display area 1200 of the display panel 1100, for example, the display area 1200 is evenly divided into nine areas (blocks) as shown in (a) in FIG. 16. In detail, one photomask corresponding to each of nine division areas 1200A to 1200I is prepared, and exposure is performed nine times for the nine division areas 1200A to 1200I in sequence using the photomask, to expose the whole display area 1200. After the whole display area 1200 is exposed, development and the like are performed to form the openings. The partition wall of the predetermined shape can be obtained as a result.

However, simply dividing the display area in the above-mentioned manner causes the following problem. The photomask is positionally deviated for each division area due to an exposure accuracy problem, which makes the photomask joint (division line) in the partition wall noticeable. In detail, in the case where the photomask is not accurately aligned for each of the nine division areas 1200A to 1200I in (a) in FIG. 16, the pattern of the partition wall is misaligned between adjacent pixels at the photomask joint. As an example, the pattern of the partition wall in a pixel 1300D corresponding to the division area 1200D and the pattern of the partition wall in a pixel 1300E corresponding to the division area 1200E which is right-adjacent to the division area 1200D are misaligned in the pixel column direction as shown in (b) in FIG. 16.

In view of this, the following patterning method has been proposed (see Patent Literature (PTL) 1). In the case of performing division exposure, one photomask overlaps another photomask at the photomask joint. The mask pattern in the photomask overlapping part is, for example, a pixelwise zigzag pattern so that the division line is not linear.

The patterning method disclosed in PTL 1 relates to patterning of pixel electrodes and the like. As shown in FIG. 17, a first photomask 2100 and a second photomask 2200 each have an overlapping part corresponding to pixel patterns of three pixels. Patterning areas 2101 and 2201 of the respective first photomask 2100 and second photomask 2200 and light shielding areas 2102 and 2202 of the respective first photomask 2100 and second photomask 2200 are alternately arranged in a zigzag in the vertical and horizontal directions. Hence, even when misalignment occurs at the photomask joint, such misalignment can be made less noticeable.

CITATION LIST

Patent Literature

[PTL 1]
Japanese Unexamined Patent Application Publication No. 9-236930

SUMMARY OF INVENTION

Technical Problem

However, merely modifying the photomask pattern on a pixel basis cannot solve a problem that, when misalignment occurs at the photomask joint, misalignment of the partition wall at the photomask joint is recognizable. In other words, the above-mentioned method has a problem that pixel misalignment associated with photomask positional deviation cannot be sufficiently reduced.

The present invention has been made in view of the problem stated above, and has an object of providing a method of manufacturing a display panel whereby, in the case of performing division exposure, misalignment of a partition wall at a photomask joint can be made unnoticeable without using a photomask of a complex mask pattern.

Solution to Problem

To solve the problem stated above, a method of manufacturing a display panel according to an aspect of the present invention is a method of manufacturing a display panel that includes a light emitting layer separated by a partition wall, the method including: forming a partition wall layer above a substrate; exposing a first area of the partition wall layer using a first photomask that corresponds to a first plurality of openings; exposing a second area of the partition wall layer using a second photomask that corresponds to a second plurality of openings, the second area partially overlapping the first area; forming the partition wall by removing a part of the partition wall layer corresponding to the first plurality of openings and the second plurality of openings to form the first plurality of openings and the second plurality of openings in the partition wall layer; and forming the light emitting layer in each of the first plurality of openings and the second plurality of openings, wherein a predetermined number of pixels from among the first plurality of openings and the second plurality of openings form a unit constituting one pixel, the first photomask has a mask pattern in which at least one of the first plurality of openings in an overlapping area corresponds to an opening in the pixel, the overlapping area being an area where the first area and the second area overlap each other, and the second photomask has a mask pattern in which at least one of the second plurality of openings in the overlapping area corresponds to an other opening in the pixel.

Advantageous Effects of Invention

According to the present invention, pattern misalignment of a partition wall at a photomask joint can be made unnoticeable.

DESCRIPTION OF EMBODIMENTS

Figure 1:
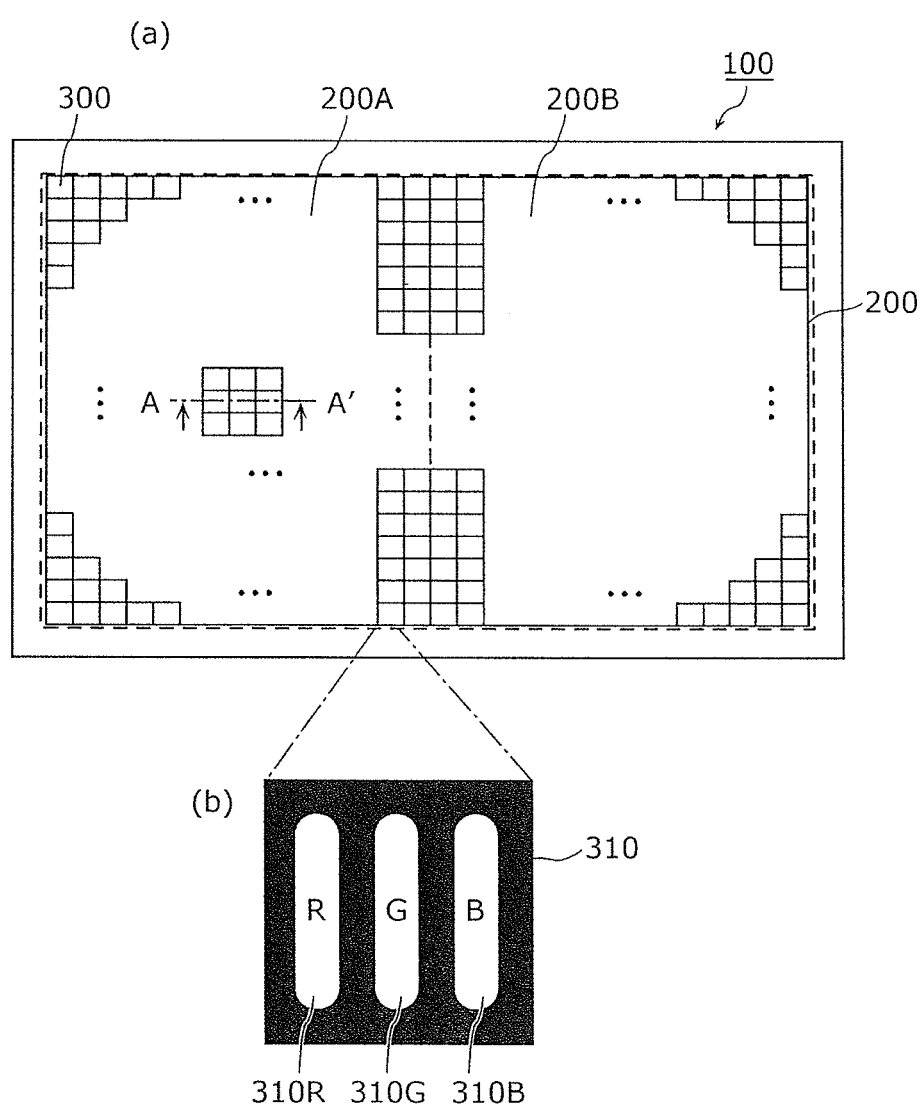
FIGS. 1 (a) and (b) is a diagram for describing a structure of a display panel according to Embodiment 1 of the present invention.

A method of manufacturing a display panel according to an aspect of the present invention is a method of manufacturing a display panel that includes a light emitting layer separated by a partition wall, the method including: forming a partition wall layer above a substrate; exposing a first area of the partition wall layer using a first photomask that corresponds to a first plurality of openings; exposing a second area of the partition wall layer using a second photomask that corresponds to a second plurality of openings, the second area partially overlapping the first area; forming the partition wall by removing a part of the partition wall layer corresponding to the first plurality of openings and the second plurality of openings to form the first plurality of openings and the second plurality of openings in the partition wall layer; and forming the light emitting layer in each of the first plurality of openings and the second plurality of openings, wherein a predetermined number of pixels from among the first plurality of openings and the second plurality of openings form a unit constituting one pixel, the first photomask has a mask pattern in which at least one of the first plurality of openings in an overlapping area corresponds to an opening in the pixel, the overlapping area being an area where the first area and the second area overlap each other, and the second photomask has a mask pattern in which at least one of the second plurality of openings in the overlapping area corresponds to an other opening in the pixel.

According to this method, when forming the partition wall by division exposure, in the overlapping area of the first photomask and the second photomask in the partition wall layer, the boundary between the first area exposed using the first photomask and the second area exposed using the second photomask is set not on a pixel basis where one pixel includes a plurality of openings, but on a subpixel basis where one subpixel corresponds to one of the plurality of openings of one pixel.

This can narrow the overlapping area of the first photomask and the second photomask, as compared with the case where the boundary between the first area exposed using the first photomask and the second area exposed using the second photomask is set on a pixel basis. The narrower photomask overlapping area contributes to less visibility of openings formed in the overlapping area. Since the photomask overlapping area itself can be made small, even when the first photomask and the second photomask deviate positionally and as a result misalignment occurs between the opening formed using the first photomask and the opening formed using the second photomask, such misalignment is unnoticeable. Therefore, in the case of forming a partition wall in one display panel using a plurality of photomasks, pixel misalignment recognized due to misalignment of the photomasks at their boundary can be reduced.

Moreover, even when misalignment occurs between the opening formed using the first photomask and the opening formed using the second photomask, such misalignment is within one pixel. When viewing display pixels, humans recognize each pixel as a pixel displaying a specific color, from a mixture of light emitted from the openings in the pixel. Accordingly, misalignment within one pixel causes no significant difference on the human recognition of the display pixel. Pixel misalignment recognized due to misalignment of the photomasks at their boundary can therefore be reduced.

Furthermore, since the boundary between the exposure area (first area) by the first photomask and the exposure area (second area) by the second photomask is set on a subpixel basis, the boundary between the exposure area by the first photomask and the exposure area by the second photomask can be made linear. This allows the mask pattern of each of the first photomask and the second photomask corresponding to the overlapping area in the partition wall layer to be linear, so that the mask pattern can be simplified. Hence, opening pattern misalignment in the overlapping area in the partition wall layer can be made unnoticeable, without increasing the number of reticles or the number of shots.

For example, the predetermined number of openings constituting the pixel may each correspond to a different one of a plurality of colors, the plurality of colors may include blue, the first photomask may have the mask pattern in which the opening in the overlapping area corresponds to an opening in which the light emitting layer for emitting blue light is formed, and the second photomask may have the mask pattern in which the other opening in the overlapping area corresponds to an opening in which the light emitting layer for emitting light of a color other than blue from among the plurality of colors is formed.

According to this method, in one pixel, the opening formed using the first photomask corresponds to the opening in which the light emitting layer for emitting blue light is formed, and the opening formed using the second photomask corresponds to the opening in which the light emitting layer for emitting light of the color other than blue is formed. Hence, when misalignment occurs between the opening formed using the first photomask and the opening formed using the second photomask in the overlapping area in the partition wall layer, such misalignment is between the opening corresponding to the light emitting layer for emitting blue light and the opening corresponding to the light emitting layer for emitting light of the color other than blue. Misalignment occurs not between pixels but between subpixels, and is obscured within one pixel. In particular, since blue is of low visibility to the human eye, when misalignment occurs between the opening corresponding to the light emitting layer for emitting blue light and the opening corresponding to the light emitting layer for emitting light of the color other than blue, such misalignment is hardly recognizable to the human eye. Therefore, in the case of forming a partition wall in one display panel using a plurality of photomasks, pixel misalignment recognized due to misalignment of the photomasks at their boundary can be further reduced.

For example, the predetermined number of openings constituting the pixel may further include an opening corresponding to the light emitting layer for emitting red light and an opening corresponding to the light emitting layer for emitting green light, and the second photomask may have the mask pattern in which the other opening in the overlapping area corresponds to the opening in which the light emitting layer for emitting red light is formed and the opening in which the light emitting layer for emitting green light is formed.

For example, the first plurality of openings and the second plurality of openings formed in the partition wall layer may be separated for each light emitting layer for emitting light of a different one of the plurality of colors in the pixel.

For example, the first photomask and the second photomask may be arranged in a direction perpendicular to an arrangement direction in which the predetermined number of openings constituting the pixel are arranged, and openings located in the overlapping area from among the first plurality of openings and the second plurality of openings may be formed using the first photomask and the second photomask that are arranged in the direction perpendicular to the arrangement direction. Alternatively, the first photomask and the second photomask may be arranged parallel to an arrangement direction in which the predetermined number of openings constituting the pixel are arranged, and openings located in the overlapping area from among the first plurality of openings and the second plurality of openings may be formed using the first photomask and the second photomask arranged in a direction parallel to the arrangement direction.

For example, the exposure using the first photomask and the second photomask may be a positive process, and the part of the partition wall layer corresponding to the first plurality of openings and the second plurality of openings may be exposed. Alternatively, the exposure using the first photomask and the second photomask may be a negative process, and a part of the partition wall layer other than the part corresponding to the first plurality of openings and the second plurality of openings may be exposed.

For example, the formed light emitting layer may be an organic light emitting layer.

For example, pixels including the first plurality of openings and the second plurality of openings may include a first pixel and a second pixel, the first photomask may have the mask pattern in which the first plurality of openings in the overlapping area correspond at least to an opening in the first pixel and an opening in the second pixel, the second photomask may have the mask pattern in which the second plurality of openings in the overlapping area correspond at least to an other opening in the first pixel and an other opening in the second pixel, and in the forming of the partition wall, the opening in the first pixel and the other opening in the second pixel may be each formed as an opening corresponding to the light emitting layer for emitting light of a same color.

According to this method, the mask pattern of each of the first photomask and the second photomask corresponding to the overlapping area includes patterns corresponding to the openings of the light emitting layers for emitting light of different colors and the light emitting layer for emitting light of the same color. That is, the mask patterns corresponding to the openings of one pixel are formed in each of the first photomask and the second photomask corresponding to the overlapping area in the partition wall layer. This alleviates the regularity of openings formed in the overlapping area, with it being possible to make opening misalignment in each pixel in the overlapping area less recognizable. Therefore, in the case of forming a partition wall in one display panel using a plurality of photomasks, pixel misalignment recognized due to misalignment of the photomasks at their boundary can be further reduced.

For example, the predetermined number of openings constituting each of the first pixel and the second pixel may each correspond to a different one of a plurality of colors, the plurality of colors may include blue, the first photomask may have the mask pattern in which the opening in the first pixel in the overlapping area corresponds to an opening in which the light emitting layer for emitting blue light is formed, and the second photomask may have the mask pattern in which the other opening in the second pixel in the overlapping area corresponds to an opening in which the light emitting layer for emitting blue light is formed.

According to this method, in each of the first photomask and the second photomask corresponding to the overlapping area, not only the mask pattern corresponding to the openings of one pixel is formed, but also one opening corresponds to the light emitting layer for emitting blue light. This alleviates the regularity of openings formed in the overlapping area. Besides, since misalignment occurs at the boundary of the opening corresponding to blue which is of low visibility to the human eye, such misalignment is hardly recognizable to the human eye. Therefore, in the case of forming a partition wall in one display panel using a plurality of photomasks, pixel misalignment recognized due to misalignment of the photomasks at their boundary can be further reduced.

[Embodiments]

The following describes a method of manufacturing a display panel according to the present invention by way of embodiments, with reference to drawings. Each of the embodiments described below shows a preferred example of the present invention. The numerical values, shapes, materials, structural elements, the arrangement and connection of the structural elements, steps, the processing order of the steps etc. shown in the following embodiments are mere examples, and do not limit the scope of the present invention. Accordingly, among the structural elements in the embodiments described below, the structural elements not recited in any one of the independent claims representing the broadest concepts of the present invention are described as arbitrary structural elements.

Note that each drawing is a schematic and does not necessarily provide precise depiction. The same structural elements are given the same reference signs throughout the drawings, and their detailed description is omitted or simplified.

[Embodiment 1]

Figure 2:
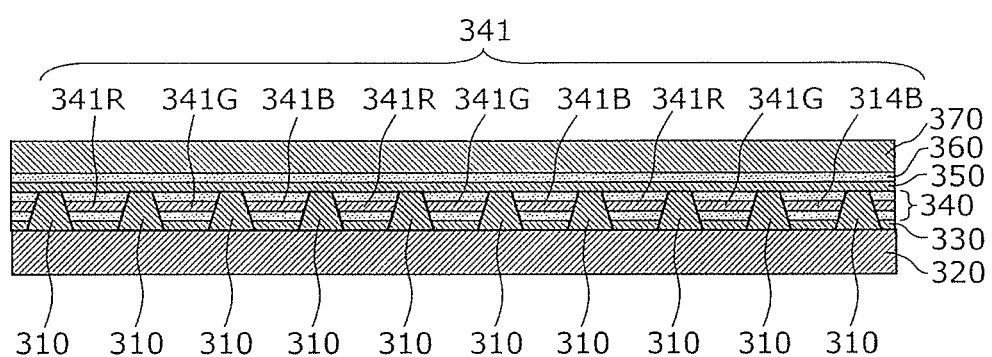
FIG. 2 is a cross section diagram of the display panel according to Embodiment 1 of the present invention taken along line A-A' in FIG. 1.

A structure of a display panel 100 according to Embodiment 1 of the present invention is described first, with reference to FIGS. 1 and 2. FIG. 1 is a diagram for describing the structure of the display panel according to Embodiment 1 of the present invention. FIG. 2 is a cross section diagram of the display panel taken along line A-A' in FIG. 1.

As shown in (a) in FIG. 1, the display panel 100 includes a display area 200 for displaying an image. The display area 200 is composed of a plurality of pixels that are separated by a partition wall (bank). In the case of forming the partition wall in the display panel 100, the display area 200 is divided into a plurality of areas (blocks) to perform exposure, development, and the like. For example, the display area 200 is evenly divided in the horizontal direction into two division areas 200A and 200B to perform exposure, development, and the like, as shown in (a) in FIG. 1.

Each of the division areas 200A and 200B corresponds to one shot of a photomask, and is composed of a plurality of pixels 300 arranged in a matrix. Each pixel 300 includes a partition wall 310 in which a plurality of openings are formed. The partition wall 310 in this embodiment has a red opening 310R which is an opening corresponding to a light emitting layer (red light emitting layer) for emitting red light, a green opening 310G which is an opening corresponding to a light emitting layer (green light emitting layer) for emitting green light, and a blue opening 310B which is an opening corresponding to a light emitting layer (blue light emitting layer) for emitting blue light, as shown in (b) in FIG. 1.

The display panel 100 in this embodiment is an organic EL display panel formed by a method of coating with an organic material for light emitting layers and the like. As shown in FIG. 2, the display panel 100 includes: a substrate 320; an organic EL element including a lower electrode (anode) 330, an organic layer 340 including a light emitting layer 341, and an upper electrode (cathode) 350 that are formed above the substrate 320 in this order; the partition wall 310 of the predetermined shape to separate the light emitting layer 341 into a plurality of light emitting areas; a sealing resin layer 360; and a translucent substrate 370.

The partition wall 310 is a bank for separating the light emitting layer 341 according to color. For example, the partition wall 310 is made of a black photosensitive resin such as a resist.

The substrate 320 is a transparent glass substrate made of transparent non-alkali glass. A planarizing layer including: a drive circuit including a circuit element such as a thin film transistor; and a planarizing film for planarizing the drive circuit may be provided between the substrate 320 and the organic EL element, though not shown.

The lower electrode 330 is an anode formed separately for each pixel, and can be provided as a reflective electrode. For example, the lower electrode 330 can be made of a reflective metal such as aluminum (Al).

The light emitting layer 341 is composed of a red light emitting layer 341R corresponding to the red opening 310R of the partition wall 310, a green light emitting layer 341G corresponding to the green opening 310G of the partition wall 310, and a blue light emitting layer 341B corresponding to the blue opening 310B of the partition wall 310.

Each of the red light emitting layer 341R, the green light emitting layer 341G, and the blue light emitting layer 341B emits light when the light emitting material of the light emitting layer is excited by energy generated as a result of electrons, which are injected by application of a predetermined voltage to the lower electrode 330 and the upper electrode 350, recombining with holes. Each light emitting layer is an organic light emitting layer made of an organic material that has a predetermined electroluminescence function for the corresponding color.

The upper electrode 350 is a cathode formed facing the lower electrode 330, and can be provided as a transparent electrode. For example, the upper electrode 350 can be made of a transparent metal oxide such as ITO (Indium Tin Oxide). The upper electrode 350 is a common electrode common to all pixels.

The organic layer 340 may include not only the light emitting layer 341 but also a hole injection layer, a hole transport layer, an electron transport layer, or an electron injection layer. The sealing resin layer 360 is formed above the upper electrode 350, and the translucent substrate 370 such as a glass substrate is bonded onto the sealing resin layer 360 via a bonding resin layer (not shown).

Figure 3:
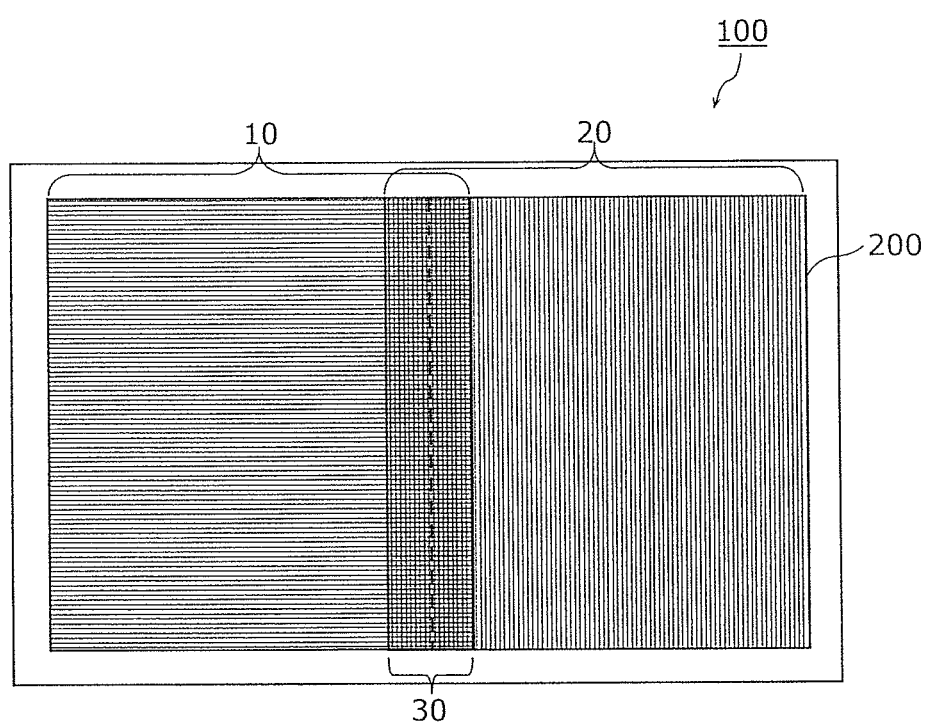
FIG. 3 is a diagram for describing an arrangement relation between a display panel and photomasks in a method of manufacturing a display panel according to Embodiment 1 of the present invention.

The relation between the display panel 100 and photomasks in the case of forming the partition wall 310 is described below, with reference to FIG. 3. FIG. 3 is a diagram for describing the arrangement relation between the display panel and the photomasks in a method of manufacturing a display panel according to Embodiment 1 of the present invention.

In this embodiment, two types of photomasks, i.e. a first photomask 10 and a second photomask 20, are used to form the partition wall 310, as shown in FIG. 3. The first photomask 10 shown by horizontal hatching in FIG. 3 is arranged to correspond to the division area 200A shown in FIG. 1. The second photomask 20 shown by vertical hatching in FIG. 3 is arranged to correspond to the division area 200B shown in FIG. 1.

The first photomask 10 is a photomask for exposing a first area of a partition wall layer which serves as a base layer for forming the partition wall 310, and has a pattern corresponding to a first plurality of openings of the partition wall 310. The second photomask 20 is a photomask for exposing a second area of the partition wall layer, and has a pattern corresponding to a second plurality of openings of the partition wall 310.

When exposing the partition wall layer, the first photomask 10 and the second photomask 20 are arranged on the partition wall layer so that the first area exposed using the first photomask 10 and the second area exposed using the second photomask 20 partially overlap each other. That is, an overlapping area 30 is set in the partition wall layer as an area (overlapping exposure area) where the first area exposed using the first photomask 10 and the second area exposed using the second photomask 20 overlap each other, as shown in FIG. 3.

The overlapping area 30 is an area corresponding to the horizontally overlapping part of the first photomask 10 and the second photomask 20. Upon each exposure, the first photomask 10 and the second photomask 20 are arranged so that their overlapping areas 30 match. That is, upon each exposure, the first photomask 10 and the second photomask 20 are arranged parallel to the direction in which a predetermined number of openings constituting one pixel are arranged.

Figure 4:
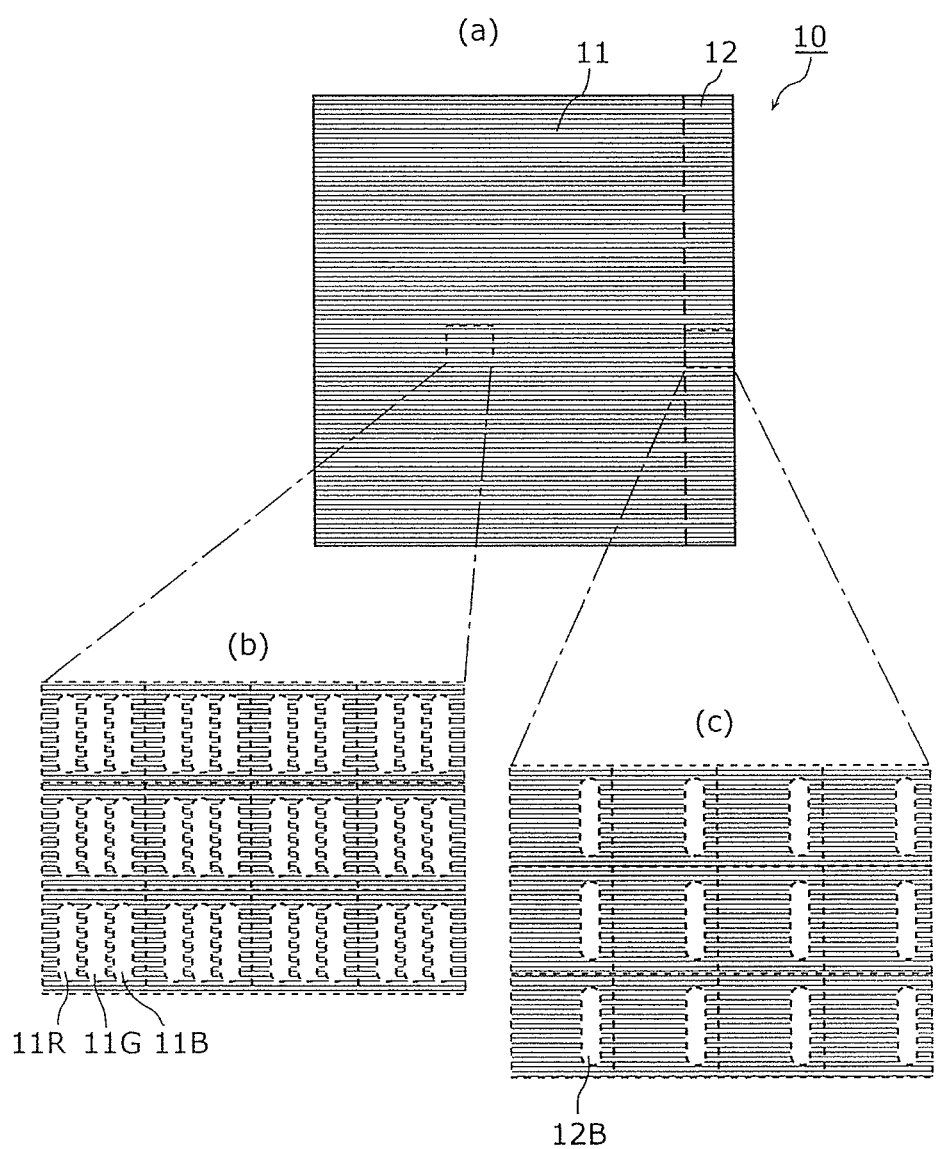
FIG. 4 (a)-(c) is a diagram showing a structure of a first photomask used in the method of manufacturing a display panel according to Embodiment 1 of the present invention.
Figure 5:
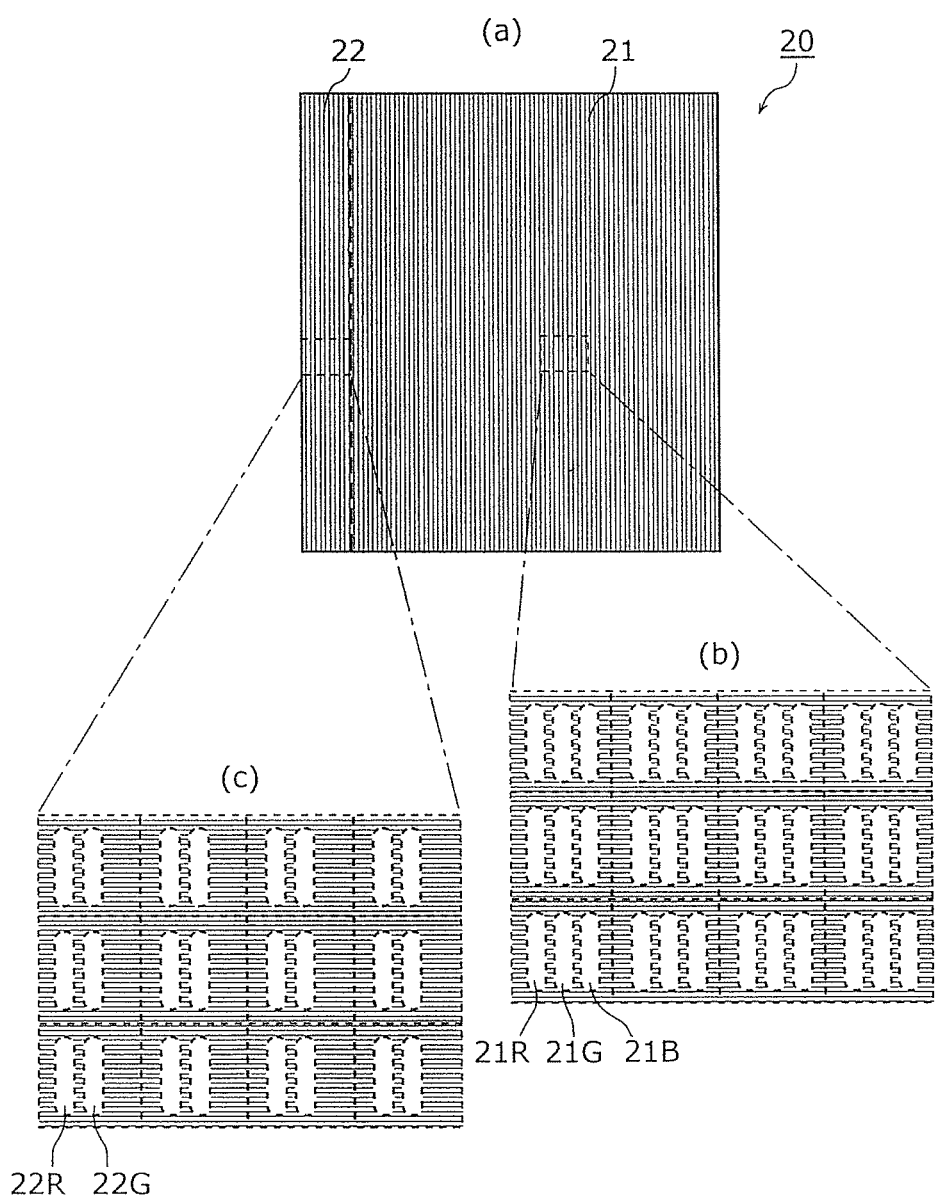
FIG. 5 (a)-(c) is a diagram showing a structure of a second photomask used in the method of manufacturing a display panel according to Embodiment 1 of the present invention.

The mask patterns of the first photomask 10 and the second photomask 20 are described below, with reference to FIGS. 4 and 5. FIG. 4 is a diagram showing the structure of the first photomask used in the method of manufacturing a display panel according to Embodiment 1 of the present invention. FIG. 5 is a diagram showing the structure of the second photomask used in the method of manufacturing a display panel according to Embodiment 1 of the present invention.

As shown in (a) in FIG. 4, in the first photomask 10, a mask pattern in a main area 11 and a mask pattern in an edge area 12 which is a peripheral area of the main area 11 are different from each other.

The mask pattern in the main area 11 is the same pattern on a pixel basis, and corresponds to the predetermined number of openings of one pixel in the partition wall 310. As shown in (b) in FIG. 4, the mask pattern in the main area 11 in this embodiment is such a pattern that includes the openings of one pixel (three openings of RGB), per pixel. In detail, the mask pattern in the main area 11 is composed of a red opening pattern 11R which is an opening corresponding to the red opening 310R, a green opening pattern 11G which is an opening corresponding to the green opening 310G, and a blue opening pattern 11B which is an opening corresponding to the blue opening 310B.

The mask pattern in the edge area 12 is a pattern corresponding to one opening in one pixel, per pixel. In this embodiment, the mask pattern in the edge area 12 is the same pattern on a subpixel basis. In detail, as shown in (c) in FIG. 4, the mask pattern in the edge area 12 is composed of only a blue opening pattern 12B which is an opening corresponding to the blue opening 310B. The blue opening pattern 12B in the edge area 12 is drawn along the pixel column direction.

In this embodiment, the blue opening pattern 11B in the main area 11 and the blue opening pattern 12B in the edge area 12 have the same shape and size.

As shown in (a) in FIG. 5, in the second photomask 20, a mask pattern in a main area 21 and a mask pattern in an edge area 22 which is a peripheral area of the main area 21 are different from each other. Note that the second photomask 20 has the same entire shape and size as the first photomask 10. Moreover, the main area 21 in the second photomask 20 has the same shape and size as the main area 11 in the first photomask 10, and the edge area 22 in the second photomask 20 has the same shape and size as the edge area 12 in the first photomask 10.

The mask pattern in the main area 21 of the second photomask 20 is the same as the mask pattern in the main area 11 of the first photomask 10. The mask pattern in the main area 21 is the same pattern on a pixel basis, and corresponds to the predetermined number of openings of one pixel in the partition wall 310. As shown in (b) in FIG. 5, the mask pattern in the main area 21 in this embodiment is such a pattern that includes the openings of one pixel (three openings of RGB), per pixel. In detail, the mask pattern in the main area 21 is composed of a red opening pattern 21R which is an opening corresponding to the red opening 310R, a green opening pattern 21G which is an opening corresponding to the green opening 310G, and a blue opening pattern 21B which is an opening corresponding to the blue opening 310B.

The mask pattern in the edge area 22 of the second photomask 20 is the same as the mask pattern in the edge area 12 of the first photomask 10 in that it corresponds to a subpixel-based opening in one pixel in the partition wall 310, but differs in that it corresponds to an opening of a light emitting layer for emitting light of a different color.

That is, the mask pattern in the edge area 22 of the second photomask 20 is a pattern corresponding to an other opening in one pixel in the partition wall 310. As shown in (c) in FIG. 5, the mask pattern in the edge area 22 is composed of a red opening pattern 22R which is an opening corresponding to the red opening 310R and a green opening pattern 22G which is an opening corresponding to the green opening 310G. The red opening pattern 22R and the green opening pattern 22G are drawn in parallel along the pixel column direction. The mask pattern in the edge area 22 of the second photomask 20 is the same pattern on a subpixel basis, as with the mask pattern in the edge area 12 of the first photomask 10.

In this embodiment, the red opening pattern 21R and the green opening pattern 21G in the main area 21 and the red opening pattern 22R and the green opening pattern 22G in the edge area 22 have the same shape and size.

Thus, in the first photomask 10 and the second photomask 20, the mask patterns in the edge areas 12 and 22 corresponding to the overlapping area 30 in the partition wall layer are assigned the plurality of openings formed in one pixel. In this embodiment, the blue opening pattern 12B in the edge area 12 of the first photomask 10 and the red opening pattern 22R and the green opening pattern 22G in the edge area 22 of the second photomask 20 correspond to three openings of RGB of one pixel.

In this embodiment, the whole display area 200 is exposed using the two masks of the first photomask 10 and the second photomask 20 in sequence. Accordingly, all openings of the partition wall 310 in the whole display area 200 are made up of the first plurality of openings and the second plurality of openings. A predetermined number of openings from among the first plurality of openings and the second plurality of openings in the partition wall 310 form a unit constituting one pixel. In this embodiment, three openings of RGB constitute one pixel.

Figure 6A:
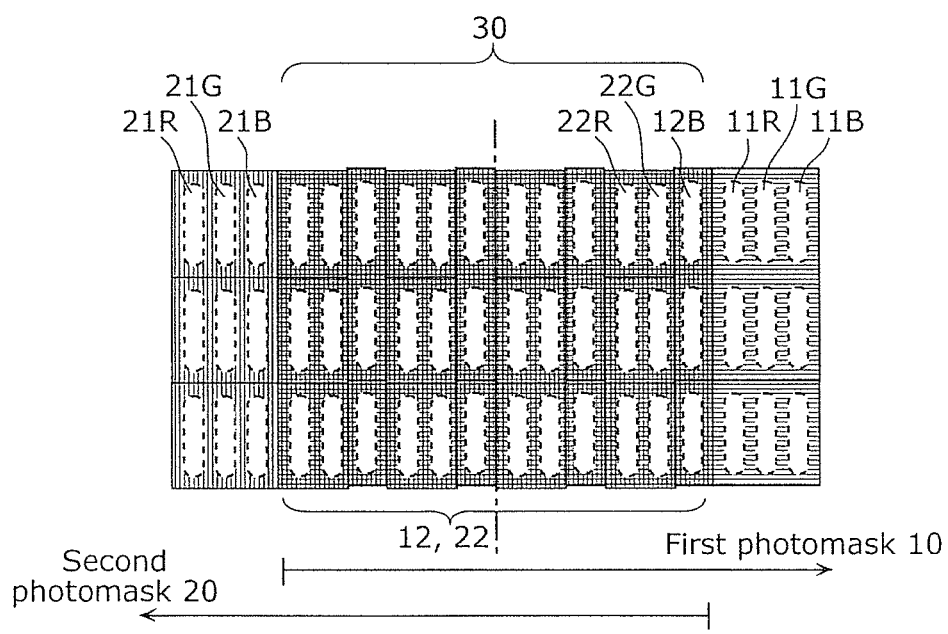
FIG. 6A is a diagram showing an arrangement relation between the first photomask and the second photomask in an overlapping area shown in FIG. 3, in the method of manufacturing a display panel according to Embodiment 1 of the present invention.
Figure 6B:
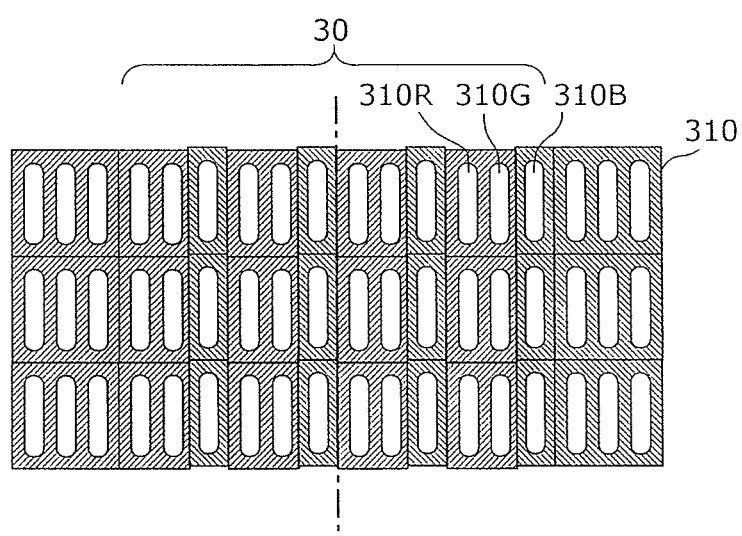
FIG. 6B is a diagram showing a pattern of a partition wall formed by the mask arrangement shown in FIG. 6A.

The arrangement of the first photomask 10 and the second photomask 20 when exposure is performed using the two masks and the partition wall 310 formed as a result are described below, with reference to FIGS. 6A and 6B. FIG. 6A is a diagram showing the arrangement relation between the first photomask and the second photomask in the overlapping area shown in FIG. 3, in the method of manufacturing a display panel according to Embodiment 1 of the present invention. FIG. 6B is a diagram showing the pattern of the partition wall formed by the mask arrangement shown in FIG. 6A.

As shown in FIG. 6A, the first photomask 10 and the second photomask 20 are arranged so that the edge area 12 of the first photomask 10 and the edge area 22 of the second photomask 20 exactly overlap each other in the pixel row direction. In this case, the edge areas 12 and 22 match the overlapping area 30 of the first photomask 10 and the second photomask 20.

Here, the combined mask pattern of the first photomask 10 and the second photomask 20 in the overlapping area 30 is assigned the openings of one pixel. Accordingly, the openings formed in the overlapping area 30 per pixel by the combination of the first photomask 10 and the second photomask 20 are exactly the number of openings of one pixel. In this embodiment, the openings formed in the overlapping area 30 per pixel by the combination of the first photomask 10 and the second photomask 20 are exactly three openings of RGB, as shown in FIG. 6A.

By performing exposure, development, and the like on the partition wall layer using the first photomask 10 and the second photomask 20 arranged in this way, the red opening 310R, the green opening 310G, and the blue opening 310B are formed in the partition wall layer in the overlapping area 30, as shown in FIG. 6B. The partition wall 310 of the predetermined shape can thus be formed.

Suppose the first photomask 10 or the second photomask 20 deviates from the predetermined position, causing misalignment between the blue opening 310B formed using the first photomask 10 and each of the red opening 310R and the green opening 310G formed using the second photomask 20, as shown in FIG. 6B. Such misalignment is between subpixels included in one pixel, and so the misalignment between the blue opening 310B and each of the red opening 310R and the green opening 310G formed in the overlapping area 30 is unnoticeable. Thus, pixel misalignment associated with photomask positional deviation can be reduced.

Figure 17:
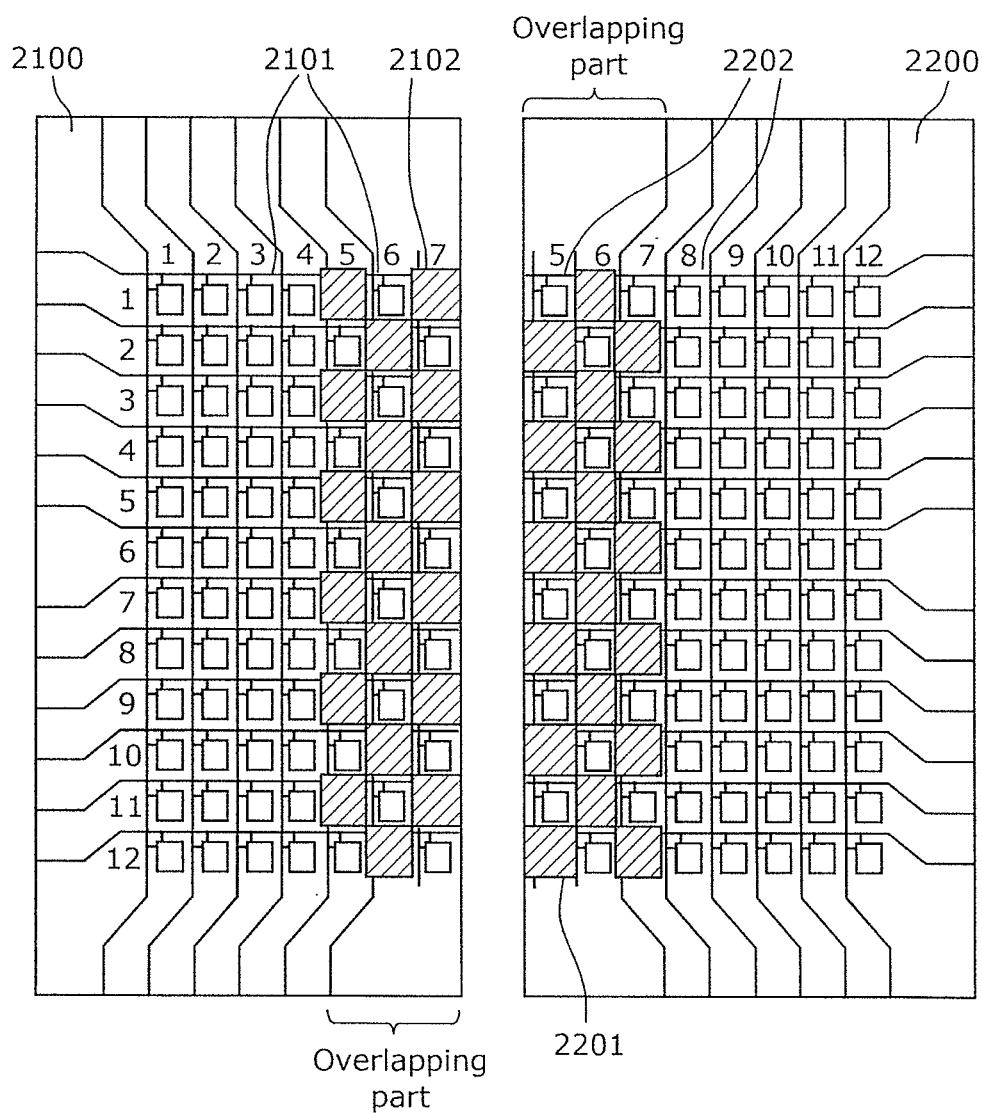
FIG. 17 is a diagram for describing a patterning method disclosed in PTL 1.

The method shown in FIG. 17 is problematic in that a photomask having a complex mask pattern, i.e. a zigzag, is needed, causing an increase in the number of reticles and the number of exposures (the number of shots). In this embodiment, on the other hand, since the boundary between the exposure area (first area) by the first photomask 10 and the exposure area (second area) by the second photomask 20 is set on a subpixel basis, opening pattern misalignment of the partition wall 310 in the overlapping area 30 can be made unnoticeable even when the boundary between the first area exposed using the first photomask 10 and the second area exposed using the second photomask 20 is linear, as shown in FIGS. 6A and 6B. In other words, opening pattern misalignment of the partition wall 310 can be made unnoticeable even when the mask pattern of each of the first photomask 10 and the second photomask 20 is simplified. Since the mask pattern can be simplified, there is no need to increase the number of reticles or the number of shots in this embodiment.

Though the first photomask 10 and the second photomask 20 are shown as overlapping each other in FIG. 6A, in actual exposure the first photomask 10 and the second photomask 20 do not overlap each other simultaneously but exposure using one of the first photomask 10 and the second photomask 20 is performed first and then exposure using the other photomask is performed.

Figure 7:
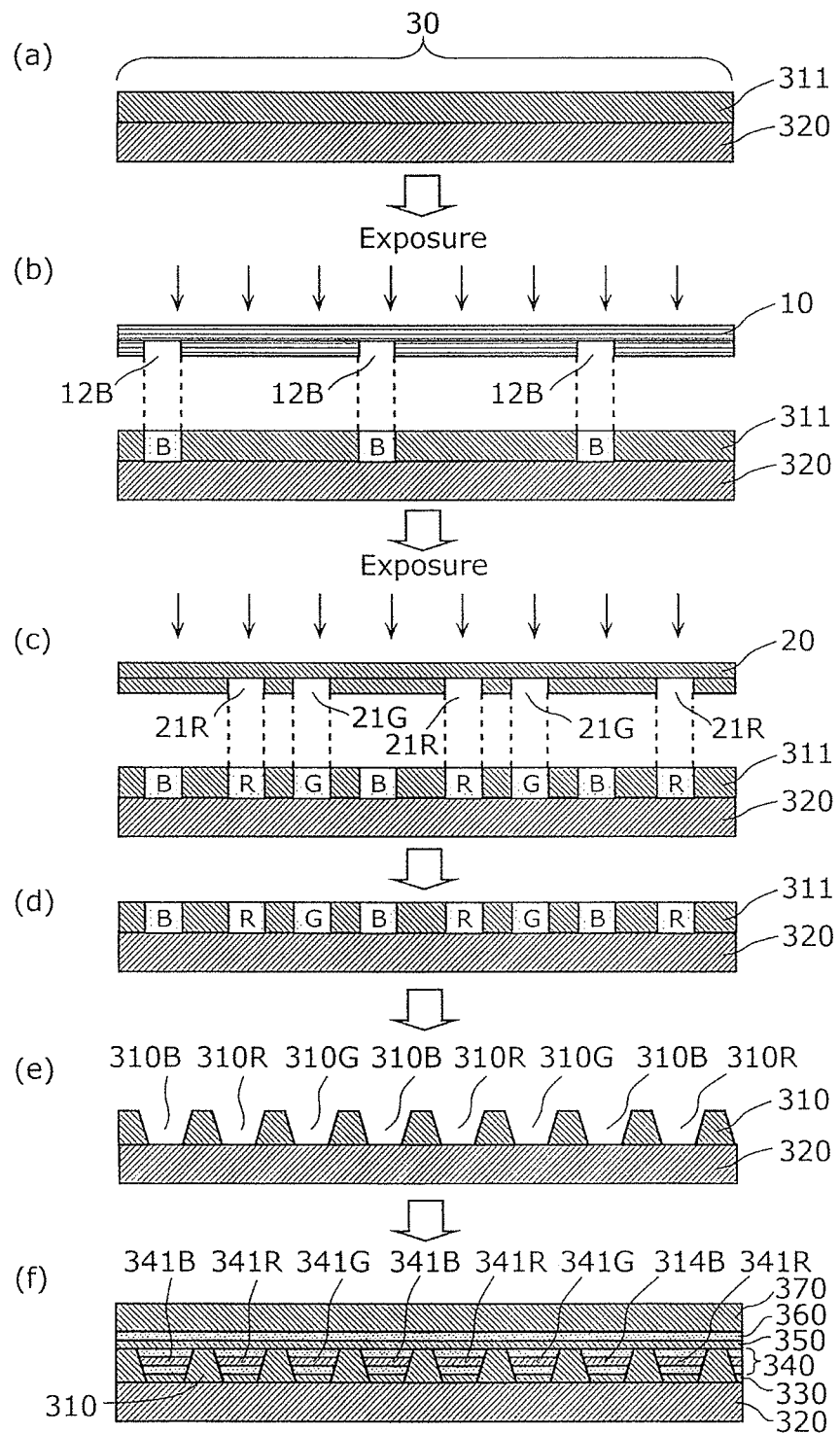
FIG. 7 (a)-(f) is a cross section diagram for describing each step of the method of manufacturing a display panel according to Embodiment 1 of the present invention.

The method of manufacturing a display panel according to Embodiment 1 of the present invention is described below. The method of manufacturing a display panel according to Embodiment 1 of the present invention includes: a first step of forming the partition wall layer above the substrate; a second step of exposing the first area of the partition wall layer using the first photomask; a third step of exposing the second area of the partition wall layer using the second photomask; a fourth step of forming the partition wall of the predetermined shape by forming the plurality of openings in the partition wall layer according to the exposure areas; and a fifth step of forming the light emitting layer in each of the plurality of openings. Each step is described in detail below, with reference to FIG. 7. FIG. 7 is a cross section diagram for describing each step of the method of manufacturing a display panel according to Embodiment 1 of the present invention. Only the overlapping area 30 (the edge areas 12 and 22) is shown in FIG. 7. Though the exposure corresponding to the main area 11 of the first photomask 10 and the main area 21 of the second photomask 20 is not described here, the exposure corresponding to the main areas 11 and 21 is performed simultaneously on the area of the partition wall layer 311 corresponding to three openings of RGB in one pixel.

First, the partition wall layer 311 made of a photosensitive resin is formed above the substrate 320, as shown in (a) in FIG. 7 (first step). The planarizing layer may be formed on the substrate 320 and, before forming the partition wall layer 311, the lower electrode 330 of the predetermined shape may be patterned on the planarizing layer, as shown in FIG. 2.

Next, the first area of the partition wall layer 311 is exposed using the first photomask 10, as shown in (b) in FIG. 7 (second step). Here, the first area of the partition wall layer 311 corresponding to the blue opening 310B is exposed using the blue opening pattern 12B of the first photomask 10.

For example, this first exposure step using the first photomask 10 is performed on the division area 200A shown in FIG. 1. In this case, the area other than the division area 200A is shielded so as not to be exposed.

Next, the second area of the partition wall layer 311 is exposed using the second photomask 20 so that the edge area 12 of the first photomask 10 and the edge area 22 of the second photomask 20 overlap in the overlapping area 30, as shown in (c) in FIG. 7 (third step). Here, the second area of the partition wall layer 311 corresponding to the red opening 310R and the green opening 310G is exposed using the red opening pattern 22R and the green opening pattern 22G of the second photomask 20.

For example, this second exposure step using the second photomask 20 is performed on the division area 200B shown in FIG. 1. In this case, the area other than the division area 200B is shielded so as not to be exposed.

As a result, the exposure of the partition wall layer 311 in the overlapping area 30 is completed, as shown in (d) in FIG. 7. That is, the exposure of the part corresponding to the predetermined number of openings constituting one pixel is completed in the partition wall layer 311 in the overlapping area 30. In this embodiment, the part of the partition wall layer 311 corresponding to three openings constituting one pixel, i.e. the red opening 310R, the green opening 310G, and the blue opening 310B, is exposed.

After completing the exposure of the whole display area 200, the partition wall layer 311 is developed using a predetermined developer. As a result, the part of the partition wall layer 311 exposed in the first exposure step and the second exposure step is removed to form the plurality of openings in the partition wall layer 311, thus forming the partition wall 310 of the predetermined shape, as shown in (e) in FIG. 7

(fourth step). In this embodiment, three openings, i.e. the red opening 310R, the green opening 310G, and the blue opening 310B, are formed in the partition wall layer 311.

Next, the light emitting layer 341 is formed in each opening of the partition wall 310, as shown in (f) in FIG. 7 (fifth step). In detail, the organic layer 340 made of a predetermined organic material is formed so as to include the red light emitting layer 341R, the green light emitting layer 341G, and the blue light emitting layer 341B respectively in correspondence with the red opening 310R, the green opening 310G, and the blue opening 310B in the partition wall 310. The upper electrode 350 is then formed above the organic layer 340. After this, the sealing resin layer 360 is formed above the upper electrode 350, the bonding resin layer (not shown) is formed above the sealing resin layer 360, and the translucent substrate 370 is attached to complete the display panel 100.

As described above, according to this embodiment, when forming the partition wall 310 by division exposure, the boundary between the area exposed using the first photomask 10 and the area exposed using the second photomask 20 in the overlapping area 30 is set on a subpixel basis.

This can narrow the overlapping area of the first photomask 10 and the second photomask 20, as compared with the case where the boundary between the exposure areas is set on a pixel basis. The narrower photomask overlapping area contributes to less visibility of openings formed in the overlapping area. Since the photomask overlapping area itself can be made small, even when the first photomask 10 or the second photomask 20 deviates from the predetermined position and as a result misalignment occurs between the blue opening 310B formed using the first photomask 10 and each of the red opening 310R and the green opening 310G formed using the second photomask 20, such misalignment is unnoticeable. Therefore, in the case of forming the partition wall 310 by division exposure, pixel misalignment recognized due to misalignment of the photomasks at their boundary can be reduced.

Moreover, even when misalignment occurs between the blue opening 310B formed using the first photomask 10 and each of the red opening 310R and the green opening 310G formed using the second photomask 20, such misalignment is within one pixel. When viewing display pixels, humans recognize each pixel as a pixel displaying a specific color, from a mixture of light of colors emitted from the openings in the pixel. Accordingly, misalignment within one pixel causes no significant difference on the human recognition of the display pixel. Pixel misalignment recognized due to misalignment of the photomasks at their boundary can therefore be reduced.

In addition, since the boundary between the exposure area (first area) by the first photomask 10 and the exposure area (second area) by the second photomask 20 is set on a subpixel basis in this embodiment, the boundary between the exposure area by the first photomask 10 and the exposure area by the second photomask 20 can be made linear. This allows the mask pattern of each of the first photomask 10 and the second photomask 20 corresponding to the overlapping area 30 to be linear, so that the mask pattern can be simplified. Hence, pattern misalignment between the blue opening 310B and each of the red opening 310R and the green opening 310G in the overlapping area 30 can be made unnoticeable, without increasing the number of reticles or the number of shots.

Furthermore, in this embodiment, the mask pattern of the first photomask 10 in the overlapping area 30 is composed of the blue opening pattern 12B corresponding to the blue opening 310B in which the blue light emitting layer 341B is formed, and the mask pattern of the second photomask 20 in the overlapping area 30 is composed of the red opening pattern 22R corresponding to the red opening 310R in which the red light emitting layer 341R is formed and the green opening pattern 22G corresponding to the green opening 310G in which the green light emitting layer 341G is formed. That is, the division line between the first photomask 10 and the second photomask 20 is situated between the green opening 310G and the blue opening 310B, and set with respect to the blue opening 310B.

Accordingly, when the first photomask 10 or the second photomask 20 deviates from the predetermined position in the overlapping area 30, opening pattern misalignment occurs between the blue opening 310B and each of the red opening 310R and the green opening 310G. That is, misalignment does not occur between pixels, but is obscured within one pixel. In particular, since blue is of low visibility to the human eye, when misalignment occurs between the blue opening 310B and each of the red opening 310R and the green opening 310G, such misalignment is hardly recognizable to the human eye. Therefore, in the case of forming the partition wall 310 by division exposure, pixel misalignment recognized due to misalignment of the photomasks at their boundary can be further reduced.

Though the organic EL display panel is manufactured by the coating method in this embodiment, the present invention is not limited to this. The advantageous effects of the present invention are, however, particularly remarkable in the method in which the light emitting area is defined by the partition wall (e.g. the coating method as in this embodiment).

As described above, when the division line of division exposure is set within one pixel (e.g. between the green opening and the blue opening) as in this embodiment, the human eye recognizes misalignment in the light emitting area, which makes misalignment between division areas (blocks) obscure and unnoticeable.

Though the positive process is employed in the exposure using the first photomask 10 and the second photomask 20 in the method of manufacturing the display panel 100 according to this embodiment, the negative process is also applicable. In detail, though the part of the partition wall layer 311 exposed using the first photomask 10 and the second photomask 20 is removed to form the partition wall 310 in this embodiment, the part of the partition wall layer 311 other than the area in which the openings are formed may be exposed to form the partition wall. The photomasks used in the negative process have the light transmitting area and the light shielding area reversed from the photomasks used in the positive process. In detail, in the positive process in this embodiment, each opening pattern in the first photomask 10 and the second photomask 20 is the light transmitting area, and the other part is the light shielding area. In the negative process, on the other hand, the part corresponding to each opening pattern in the first photomask 10 and the second photomask 20 is the light shielding area, and the other part is the light transmitting area.

[Embodiment 2]

The following describes a method of manufacturing a display panel 100 according to Embodiment 2 of the present invention. The manufacturing method in this embodiment differs from the manufacturing method in Embodiment 1 in the photomask structure. The structure of the display panel 100 in this embodiment is the same as that of the display panel 100 in Embodiment 1.

Figure 8:
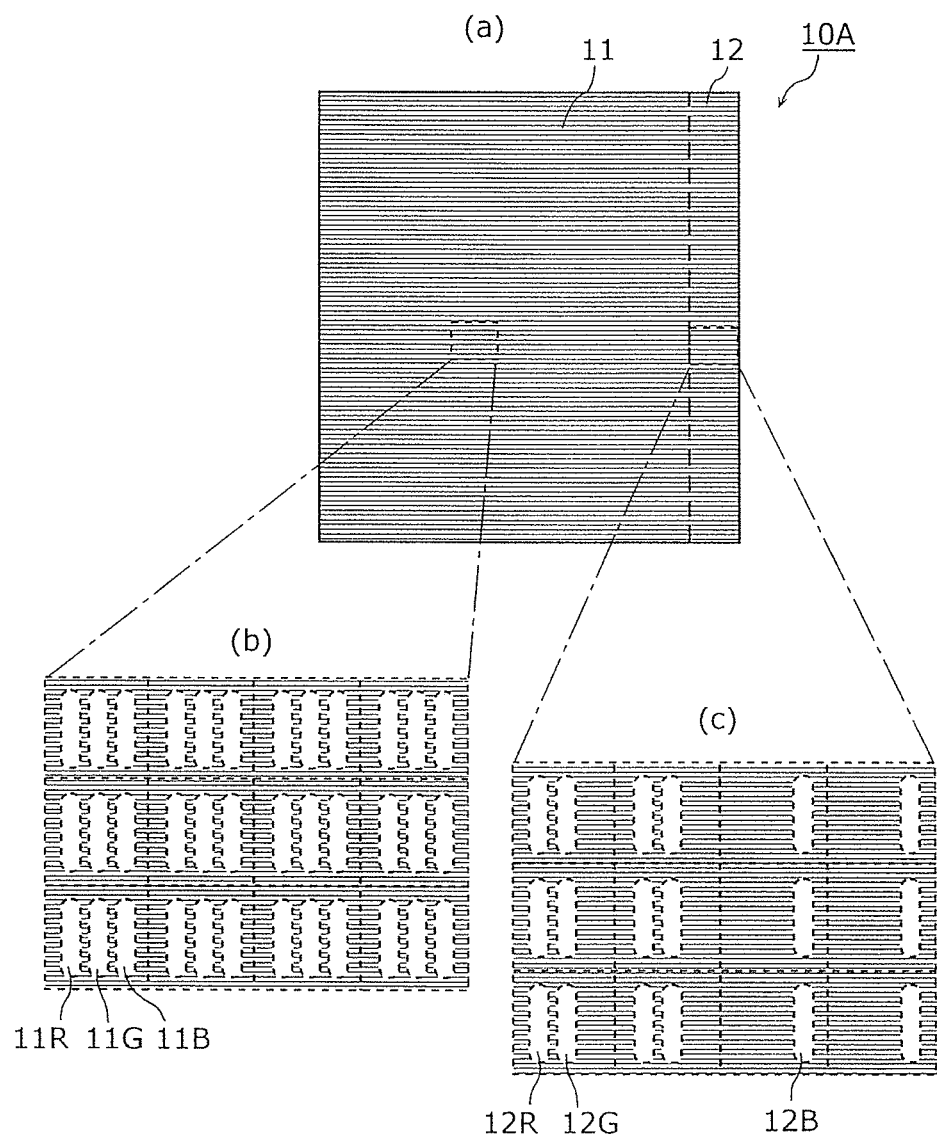
FIG. 8 (a)-(c) is a diagram showing a structure of a first photomask used in a method of manufacturing a display panel according to Embodiment 2 of the present invention.
Figure 9:
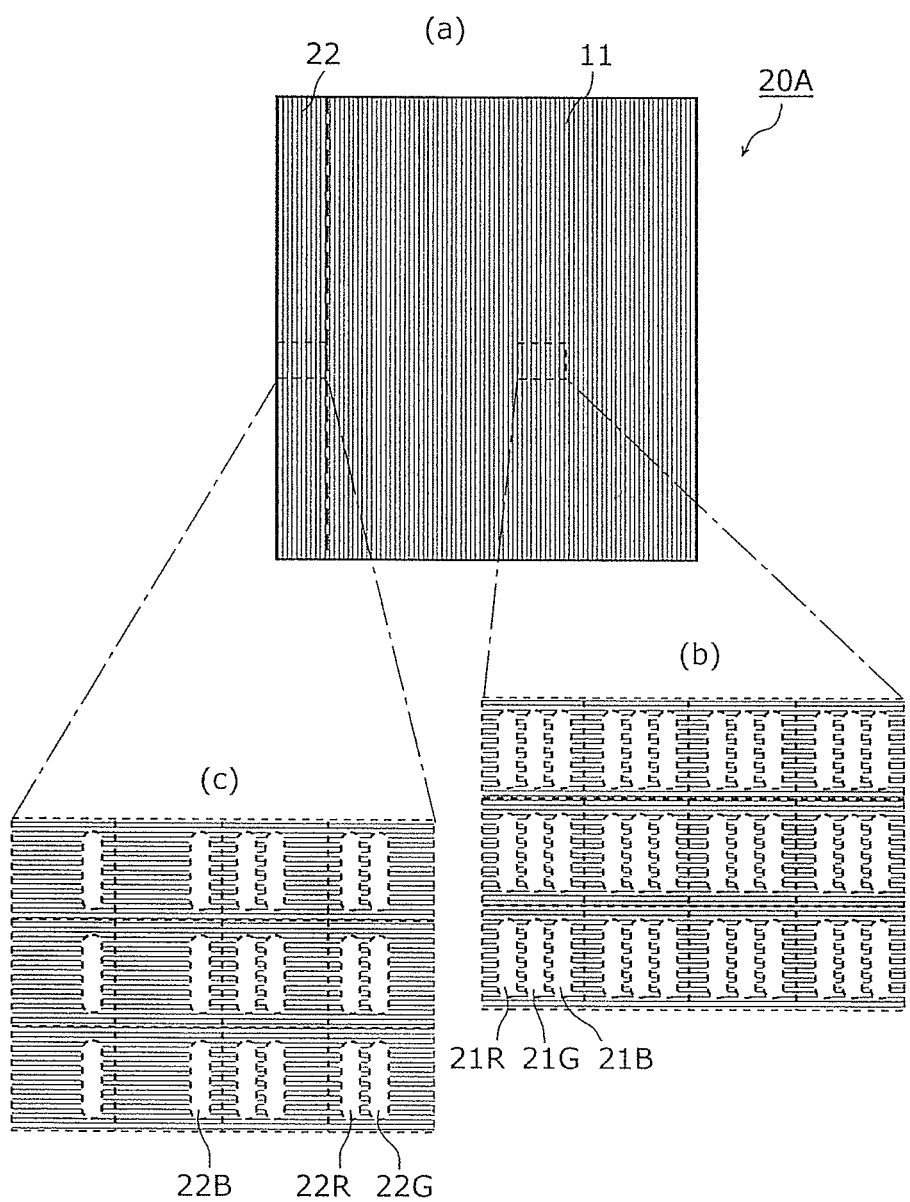
FIG. 9 (a)-(c) is a diagram showing a structure of a second photomask used in the method of manufacturing a display panel according to Embodiment 2 of the present invention.

Mask patterns of a first photomask 10A and a second photomask 20A used in this embodiment are described below, with reference to FIGS. 8 and 9. FIG. 8 is a diagram showing the structure of the first photomask used in the method of manufacturing a display panel according to Embodiment 2 of the present invention. FIG. 9 is a diagram showing the structure of the second photomask used in the method of manufacturing a display panel according to Embodiment 2 of the present invention.

As shown in (a) in FIG. 8, in the first photomask 10A in this embodiment, the mask pattern in the main area 11 and the mask pattern in the edge area 12 are different from each other, as in the first photomask 10 in Embodiment 1. The mask pattern in the main area 11 is the same as that in Embodiment 1, as shown in (b) in FIG. 8. The mask pattern in the edge area 12 of the first photomask 10A is the same as that in Embodiment 1 in that the pattern is on a subpixel basis. In this embodiment, however, patterns corresponding to subpixels of different colors are mixed in the edge area 12.

In detail, the mask pattern in the edge area 12 of the first photomask 10A is a mixture of a red opening pattern 12R corresponding to the red opening 310R, a green opening pattern 12G corresponding to the green opening 310G, and the blue opening pattern 12B corresponding to the blue opening 310B, as shown in (c) in FIG. 8.

In this embodiment, the red opening pattern 12R, the green opening pattern 12G, and the blue opening pattern 12B are arranged as follows. In an inner area of the edge area 12, the red opening pattern 12R and the green opening pattern 12G are paired with each other and drawn in parallel along the pixel column direction. In an outer area of the edge area 12, the blue opening pattern 12B is drawn linearly along the pixel column direction.

As shown in (a) in FIG. 9, in the second photomask 20A in this embodiment, the mask pattern in the main area 21 and the mask pattern in the edge area 22 are different from each other, as in the second photomask 20 in Embodiment 1. The mask pattern in the main area 21 is the same as that in Embodiment 1, as shown in (b) in FIG. 9. The mask pattern in the edge area 22 of the second photomask 20A is the same as that in Embodiment 1 in that the pattern is on a subpixel basis. In this embodiment, however, patterns corresponding to subpixels of different colors are mixed in the edge area 22.

In detail, the mask pattern in the edge area 22 of the second photomask 20A is a mixture of the red opening pattern 22R corresponding to the red opening 310R, the green opening pattern 22G corresponding to the green opening 310G, and a blue opening pattern 22B corresponding to the blue opening 310B, as shown in (c) in FIG. 9.

In this embodiment, the red opening pattern 22R, the green opening pattern 22G, and the blue opening pattern 22B are arranged as follows. In an outer area of the edge area 22, the blue opening pattern 22B is drawn linearly along the pixel column direction. In an inner area of the edge area 22, the red opening pattern 22R and the green opening pattern 22G are paired with each other and drawn in parallel along the pixel column direction.

Thus, in this embodiment, patterns corresponding to a plurality of openings of different colors are mixed in the mask pattern corresponding to the overlapping area 30. Here, in the first photomask 10A and the second photomask 20A, the mask patterns in the edge areas 12 and 22 corresponding to the overlapping area 30 are assigned the plurality of openings formed in one pixel, as in Embodiment 1.

Figure 10A:
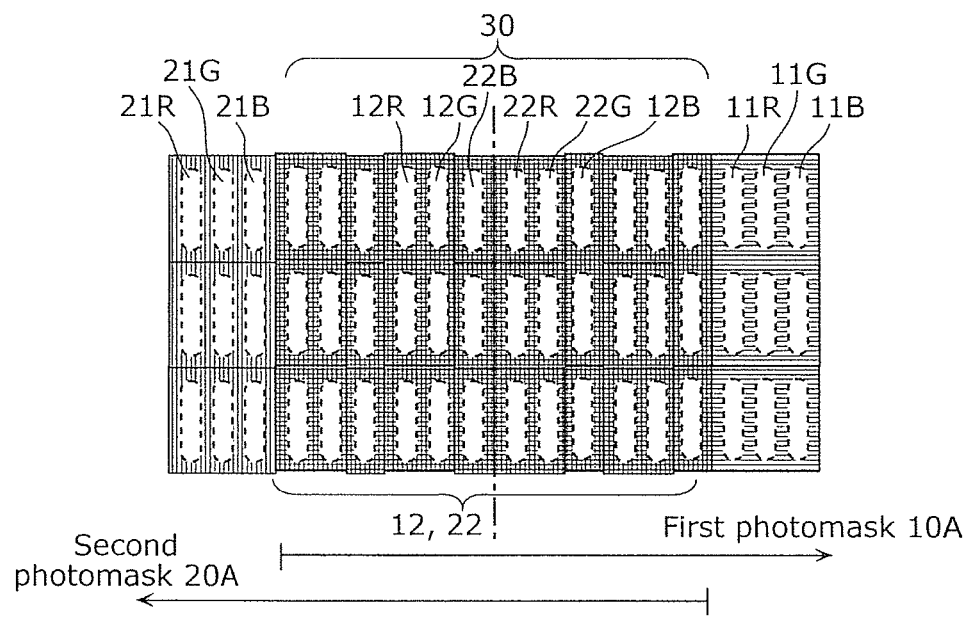
FIG. 10A is a diagram showing an arrangement relation between the first photomask and the second photomask in the overlapping area shown in FIG. 3, in the method of manufacturing a display panel according to Embodiment 2 of the present invention.
Figure 10B:
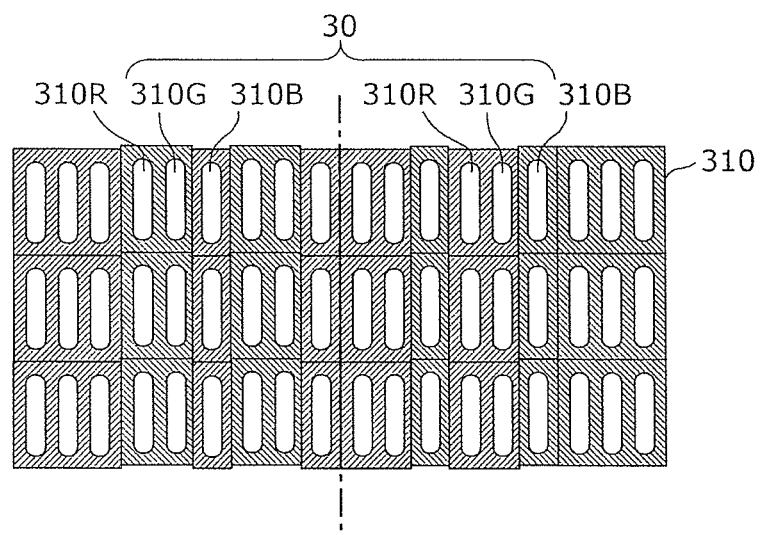
FIG. 10B is a diagram showing a pattern of a partition wall formed by the mask arrangement shown in FIG. 10A.

The arrangement of the first photomask 10A and the second photomask 20A when exposure is performed using the two masks and the partition wall 310 formed as a result are described below, with reference to FIGS. 10A and 10B. FIG. 10A is a diagram showing the arrangement relation between the first photomask and the second photomask in the overlapping area shown in FIG. 3, in the method of manufacturing a display panel according to Embodiment 2 of the present invention. FIG. 10B is a diagram showing the pattern of the partition wall formed by the mask arrangement shown in FIG. 10A.

As shown in FIG. 10A, the first photomask 10A and the second photomask 20A are arranged so that the edge area 12 of the first photomask 10A and the edge area 22 of the second photomask 20A exactly overlap each other in the pixel row direction, as in Embodiment 1. In this case, the edge areas 12 and 22 match the overlapping area 30 of the first photomask 10A and the second photomask 20A.

Here, the combined mask pattern of the first photomask 10A and the second photomask 20A in the overlapping area 30 is assigned the openings of one pixel. Accordingly, the openings formed in the overlapping area 30 per pixel by the combination of the first photomask 10A and the second photomask 20A are exactly the number of openings of one pixel. In this embodiment, the openings formed in the overlapping area 30 per pixel by the combination of the first photomask 10A and the second photomask 20A are exactly three openings of RGB, as shown in FIG. 10A.

By performing exposure, development, and the like on the partition wall layer using the first photomask 10A and the second photomask 20A arranged in this way, the red opening 310R, the green opening 310G, and the blue opening 310B are formed in the partition wall layer in the overlapping area 30 as shown in FIG. 10B. The partition wall 310 of the predetermined shape can thus be formed.

Suppose the first photomask 10A or the second photomask 20A deviates from the predetermined position, causing misalignment between the blue opening 310B formed using the first photomask 10A and each of the red opening 310R and the green opening 310G formed using the second photomask 20A and misalignment between each of the red opening 310R and the green opening 310G formed using the first photomask 10A and the blue opening 310B formed using the second photomask 20A, as shown in FIG. 10B. Such misalignment is between subpixels included in one pixel, and so the misalignment between the blue opening 310B and each of the red opening 310R and the green opening 310G formed in the overlapping area 30 is unnoticeable.

Thus, opening pattern misalignment of the partition wall 310 in the overlapping area 30 can be made unnoticeable even when the boundary between the first area exposed using the first photomask 10A and the second area exposed using the second photomask 20A is linear, as shown in FIGS. 10A and 10B. Since the mask pattern can be simplified, opening pattern misalignment of the partition wall 310 can be made unnoticeable, without increasing the number of reticles or the number of shots.

Besides, in this embodiment, the red opening pattern, the green opening pattern, and the blue opening pattern are mixed in both the edge area 12 of the first photomask 10A and the edge area 22 of the second photomask 20A. This alleviates the regularity of openings formed in the overlapping area 30, with it being possible to make opening misalignment in each pixel in the overlapping area 30 less recognizable. Therefore, in the case of forming the partition wall by division exposure, pixel misalignment recognized due to misalignment of the photomasks at their boundary can be further reduced.

The method of manufacturing the display panel 100 according to this embodiment is the same as the method of manufacturing the display panel 100 according to Embodiment 1, and each step of the manufacturing method in this embodiment is the same as that of the manufacturing method in Embodiment 1.

As described above, in the method of manufacturing the display panel 100 according to Embodiment 2 of the present invention, when forming the partition wall 310 by division exposure, the boundary between the area exposed using the first photomask 10A and the area exposed using the second photomask 20A in the overlapping area 30 is set on a subpixel basis, as in Embodiment 1.

This can narrow the overlapping area of the first photomask 10A and the second photomask 20A. The narrower photomask overlapping area contributes to less visibility of openings formed in the overlapping area. Since the photomask overlapping area itself can be made small, when the first photomask 10A or the second photomask 20A deviates from the predetermined position and as a result misalignment occurs between the openings of the partition wall 310, pixel misalignment recognized due to misalignment of the photomasks at their boundary can be reduced.

Moreover, since the boundary between the exposure area by the first photomask 10A and the exposure area by the second photomask 20A is set on a subpixel basis, the boundary between the exposure area by the first photomask 10A and the exposure area by the second photomask 20A can be made linear. This allows the mask pattern of each of the first photomask 10A and the second photomask 20A corresponding to the overlapping area 30 to be linear, so that the mask pattern can be simplified. Hence, opening pattern misalignment in the overlapping area 30 can be made unnoticeable, without increasing the number of reticles or the number of shots.

In addition, in this embodiment, the opening patterns corresponding to subpixels of different colors are mixed in the mask pattern of each of the first photomask 10A and the second photomask 20B in the overlapping area 30.

That is, regarding a first pixel and a second pixel, the mask pattern of the first photomask 10A in the overlapping area 30 includes an opening pattern (the blue opening pattern 12B) corresponding to an opening (the blue opening 310B) in the first pixel and an opening pattern (the red opening pattern 12R, the green opening pattern 12G) corresponding to an opening (the red opening 310R, the green opening 310G) in the second pixel. The mask pattern of the second photomask 20A in the overlapping area 30 includes an other opening pattern (the red opening pattern 22R, the green opening pattern 22G) corresponding to an other opening (the red opening 310R, the green opening 310G) in the first pixel and an other opening pattern (the blue opening pattern 22B) corresponding to an other opening (the blue opening 310B) in the second pixel. In the step of forming the partition wall 310 of the predetermined shape from the exposed partition wall layer 311, the opening in the first pixel and the other opening in the second pixel are both formed as the blue opening 310B, and the other opening in the first pixel and the opening in the second pixel are both formed as the red opening 310R or the green opening 310G.

Thus, in this embodiment, the mask pattern corresponding to the openings of one pixel is formed in each of the first photomask 10A and the second photomask 20A corresponding to the overlapping area 30. This alleviates the regularity of openings formed in the overlapping area 30, with it being possible to make opening misalignment in each pixel in the overlapping area 30 less recognizable. Therefore, in the case of forming the partition wall 310 by division exposure, pixel misalignment recognized due to misalignment of the photomasks at their boundary can be further reduced.

Furthermore, in this embodiment, the boundary of division exposure is set with respect to the blue opening patterns 12B and 22B corresponding to the blue opening 310B, as in Embodiment 1. When misalignment occurs between the blue opening 310B and each of the red opening 310R and the green opening 310G, such misalignment is hardly recognizable to the human eye because blue is of low visibility to the human eye. Therefore, in the case of forming the partition wall 310 by division exposure, pixel misalignment recognized due to misalignment of the photomasks at their boundary can be further reduced.

In the method of manufacturing the display panel 100 according to this embodiment, too, any of the positive process and the negative process may be employed in the exposure using the first photomask 10A and the second photomask 20A.; and

[Embodiment 3]

The following describes a method of manufacturing a display panel according to Embodiment 3 of the present invention. The display panel in this embodiment differs from the display panel 100 in Embodiment 1 in the pixel structure. In Embodiment 1, light emitting layers of three colors RGB are provided per pixel. In this embodiment, on the other hand, light emitting layers of four colors RGBW are provided per pixel. Each of the light emitting layers of four colors is formed in a different one of the plurality of openings in the partition wall. The partition wall has a red opening which is an opening corresponding to the light emitting layer (red light emitting layer) for emitting red light, a green opening which is an opening corresponding to the light emitting layer (green light emitting layer) for emitting green light, a blue opening which is an opening corresponding to the light emitting layer (blue light emitting layer) for emitting blue light, and a white opening which is an opening corresponding to the light emitting layer (white light emitting layer) for emitting white light. The photomasks used for the display panel including such a partition wall are different from the photomasks used in Embodiment 1.

Figure 11:
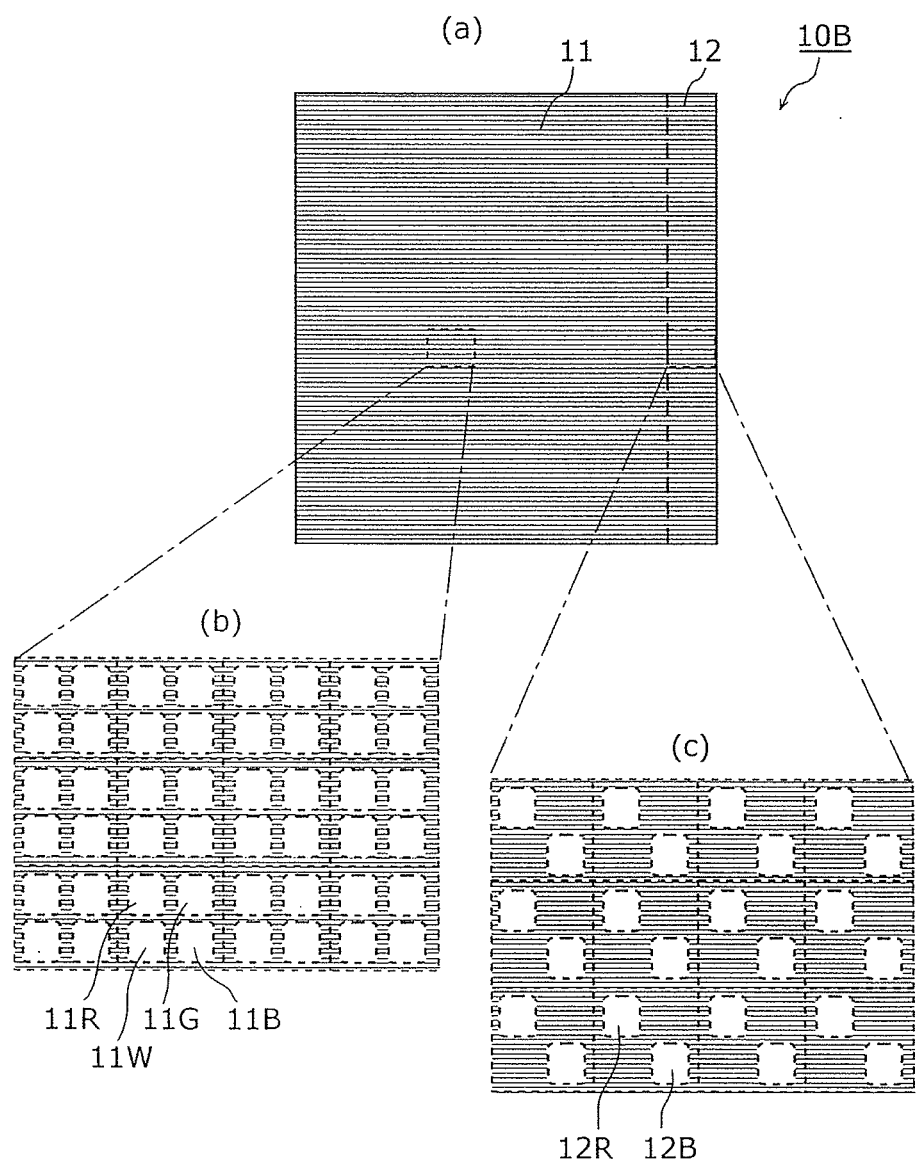
FIG. 11 (a)-(c) is a diagram showing a structure of a first photomask used in a method of manufacturing a display panel according to Embodiment 3 of the present invention.
Figure 12:
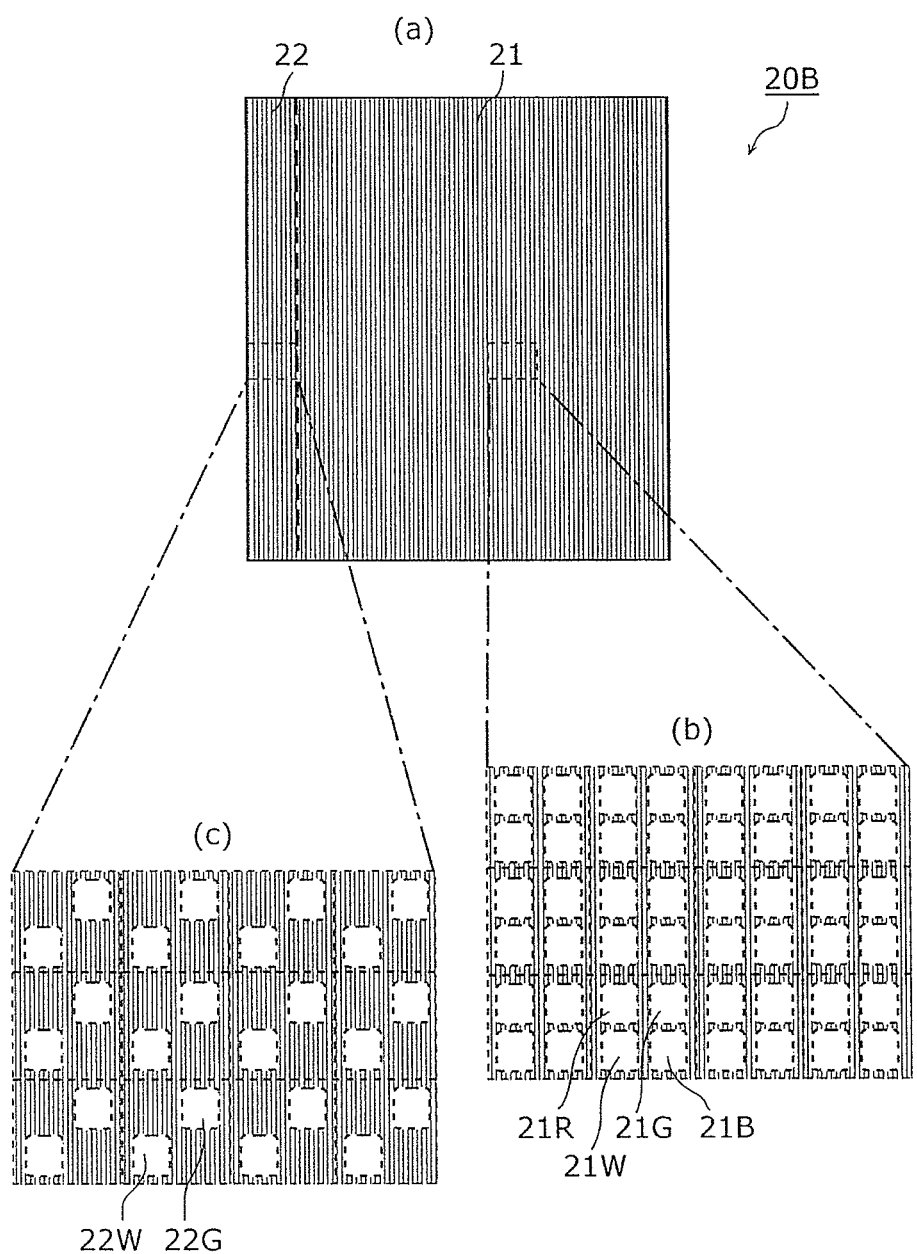
FIG. 12 (a)-(c) is a diagram showing a structure of a second photomask used in the method of manufacturing a display panel according to Embodiment 3 of the present invention.

Mask patterns of a first photomask 10B and a second photomask 20B used in this embodiment are described below, with reference to FIGS. 11 and 12. FIG. 11 is a diagram showing the structure of the first photomask used in the method of manufacturing a display panel according to Embodiment 3 of the present invention. FIG. 12 is a diagram showing the structure of the second photomask used in the method of manufacturing a display panel according to Embodiment 3 of the present invention.

As shown in (a) in FIG. 11, in the first photomask 10B in this embodiment, the mask pattern in the main area 11 and the mask pattern in the edge area 12 are different from each other, as in the first photomask 10 in Embodiment 1.

The mask pattern in the main area 11 of the first photomask 10B is the same pattern on a pixel basis, and corresponds to the predetermined number of openings of one pixel in the partition wall as in Embodiment 1. As shown in (b) in FIG. 11, however, the mask pattern in the main area 11 in this embodiment is such a pattern that includes the openings of one pixel (four openings of RGBW), per pixel. In detail, the mask pattern in the main area 11 is composed of the red opening pattern 11R which is an opening corresponding to the red opening, the green opening pattern 11G which is an opening corresponding to the green opening, the blue opening pattern 11B which is an opening corresponding to the blue opening, and a white opening pattern 11W which is an opening corresponding to the white opening.

The mask pattern in the edge area 12 is a pattern corresponding to two openings in one pixel in the partition wall, and is the same pattern on a subpixel basis. In detail, as shown in (c) in FIG. 11, the mask pattern in the edge area 12 is, per pixel, composed of the red opening pattern 12R which is an opening corresponding to the red opening and the blue opening pattern 12B which is an opening corresponding to the blue opening, the two openings being diagonally arranged in one pixel.

As shown in (a) in FIG. 12, in the second photomask 20B, the mask pattern in the main area 21 and the mask pattern in the edge area 22 which is a peripheral area of the main area 21 are different from each other.

The mask pattern in the main area 21 of the second photomask 20B is the same as the mask pattern in the main area 11 of the first photomask 10B. As shown in (b) in FIG. 12, the mask pattern in the main area 21 is, per pixel, composed of the red opening pattern 21R which is an opening corresponding to the red opening, the green opening pattern 21G which is an opening corresponding to the green opening, the blue opening pattern 21B which is an opening corresponding to the blue opening, and a white opening pattern 21W which is an opening corresponding to the white opening.

The mask pattern in the edge area 22 of the second photomask 20B is, per pixel, composed of the green opening pattern 22G which is an opening corresponding to the green opening and a white opening pattern 22W which is an opening corresponding to the white opening, the two openings being diagonally arranged in one pixel, as shown in (c) in FIG. 12.

Thus, in this embodiment, in the first photomask 10B and the second photomask 20B, the mask patterns in the edge areas 12 and 22 corresponding to the overlapping area 30 in the partition wall layer are assigned the plurality of openings formed in one pixel, as in Embodiment 1. In this embodiment, the red opening pattern 12R and the blue opening pattern 12B in the edge area 12 of the first photomask 10B and the green opening pattern 22G and the white opening pattern 22W in the edge area 22 of the second photomask 20B constitute the openings of one pixel (four openings of RGBW).

The method of manufacturing a display panel according to this embodiment is the same as the method of manufacturing the display panel 100 according to Embodiment 1, and each step of the manufacturing method in this embodiment is the same as that of the manufacturing method in Embodiment 1.

As described above, the method of manufacturing a display panel according to Embodiment 3 of the present invention achieves the same advantageous effects as in Embodiment 1.

[Embodiment 4]

Figure 13:
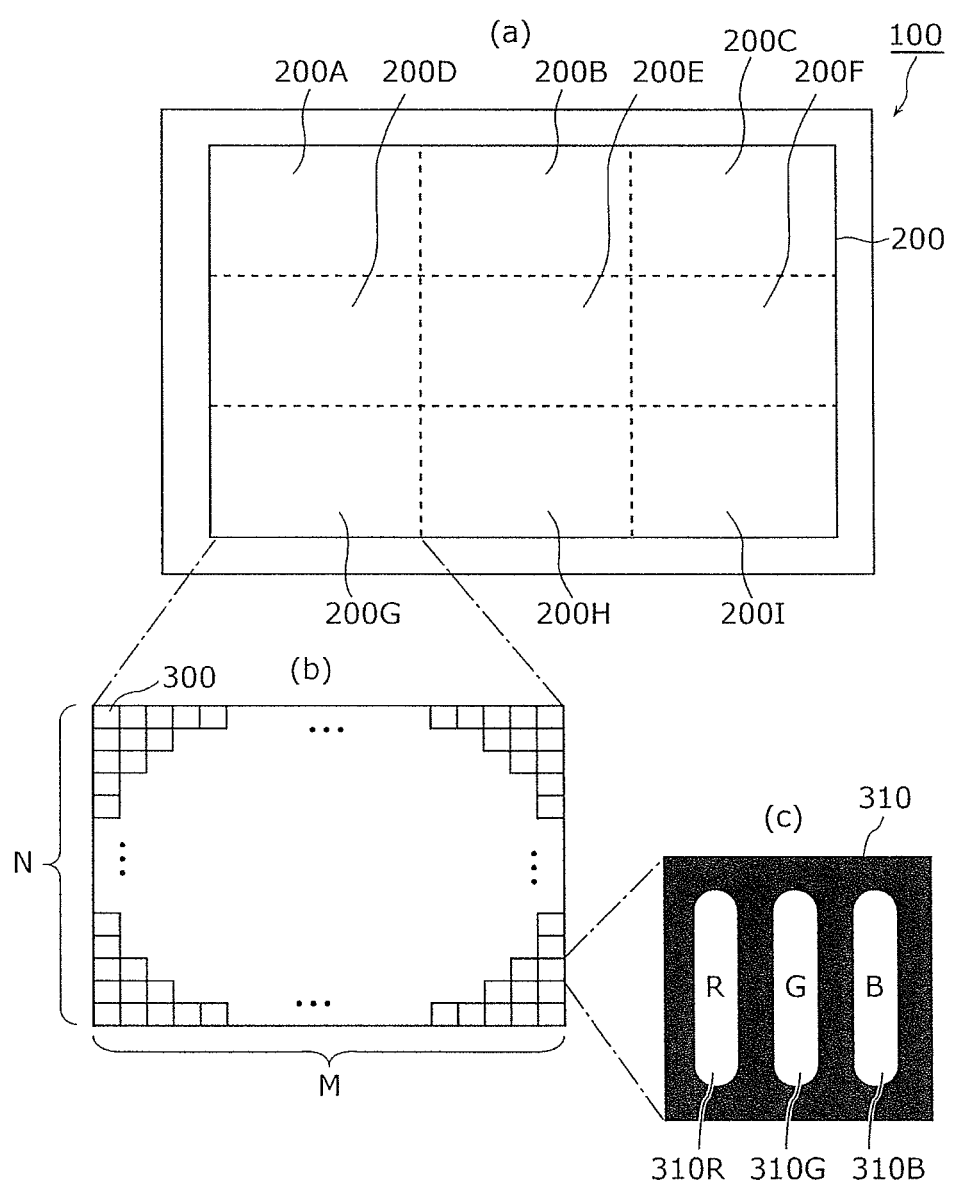
FIG. 13 (a)-(c) is a diagram for describing division areas of a display panel in a method of manufacturing a display panel according to Embodiment 4 of the present invention.

The following describes a method of manufacturing a display panel according to Embodiment 4 of the present invention, with reference to FIG. 13. FIG. 13 is a diagram for describing division areas of a display panel in the method of manufacturing a display panel according to Embodiment 4 of the present invention.

The display panel in this embodiment differs from the display panel 100 in Embodiment 1 in the number of division areas of the display area. In Embodiment 1, the display area 200 is divided into the two display areas 200A and 200B to perform exposure, development, and the like. In this embodiment, the display area 200 is evenly divided into nine division areas 200A to 200I to perform exposure, development, and the like, as shown in (a) in FIG. 13.

Each of the division areas 200A to 200I corresponds to one shot of a photomask, and is composed of a plurality of pixels 300 which are N×M pixels arranged in a matrix of N rows and M columns, as shown in (b) in FIG. 13. As shown in (c) in FIG. 13, each pixel 300 includes the partition wall 310 that has the red opening 310R, the green opening 310G, and the blue opening 310B, as in Embodiment 1.

Figure 14:
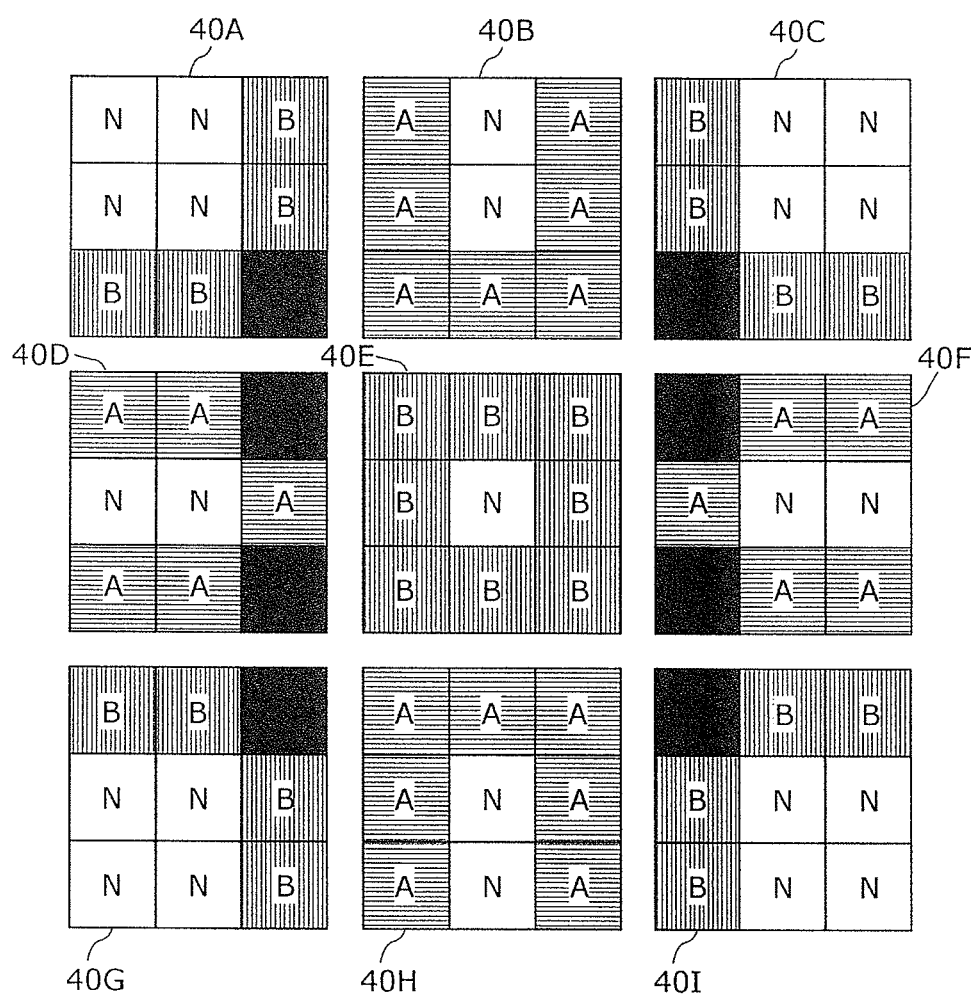
FIG. 14 is a diagram showing structures of photomasks used in the method of manufacturing a display panel according to Embodiment 4 of the present invention.

Mask patterns of photomasks for forming the partition wall 310 are described below, with reference to FIG. 14. FIG. 14 is a diagram showing the structures of the photomasks used in the method of manufacturing a display panel according to Embodiment 4 of the present invention.

As shown in FIG. 14, in this embodiment, the partition wall 310 is formed using nine photomasks, i.e. a first photomask 40A to a ninth photomask 40I. Each of the first photomask 40A to the ninth photomask 40I includes a mask pattern in a main area indicated by "N" (white box) and mask patterns in an edge area indicated by "A" (horizontal hatching), "B" (vertical hatching), and "■" (black box).

In the first photomask 40A to the ninth photomask 40I, the mask pattern in the main area indicated by "N" is a normal pixel-corresponding pattern that includes the openings of one pixel (three openings of RGB) per pixel, as shown in (b) in FIG. 4 or (b) in FIG. 5 as an example. In detail, the mask pattern in the main area indicated by "N" is composed of the red opening pattern 11R which is an opening corresponding to the red opening 310R, the green opening pattern 11G which is an opening corresponding to the green opening 310G, and the blue opening pattern 11B which is an opening corresponding to the blue opening 310B.

The mask pattern in the edge area indicated by "A" is a pattern corresponding to an opening in one pixel per pixel, and is the same pattern on a subpixel basis, as an example. In detail, the mask pattern in the edge area 12 indicated by "A" is composed of only the blue opening pattern 12B which is an opening corresponding to the blue opening 310B, as shown in (c) in FIG. 4.

The mask pattern in the edge area indicated by "B" is a pattern corresponding to an other opening in one pixel in the partition wall 310. For example, the mask pattern in the edge area 12 indicated by "B" is composed of the red opening pattern 22R which is an opening corresponding to the red opening 310R and the green opening pattern 22G which is an opening corresponding to the green opening 310G, as shown in (c) in FIG. 5.

The mask pattern in the edge area indicated by "■" is a light shielding area in which no opening pattern is formed.

Figure 15:
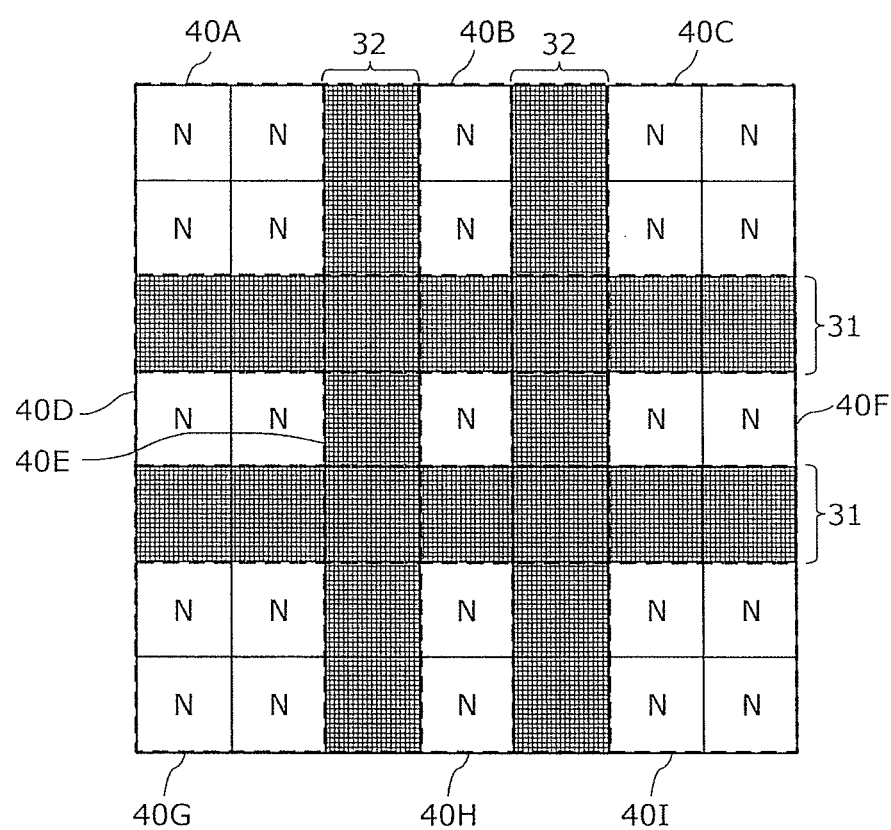
FIG. 15 is a diagram for describing an arrangement relation between the photomasks in the method of manufacturing a display panel according to Embodiment 4 of the present invention.
Figure 16:
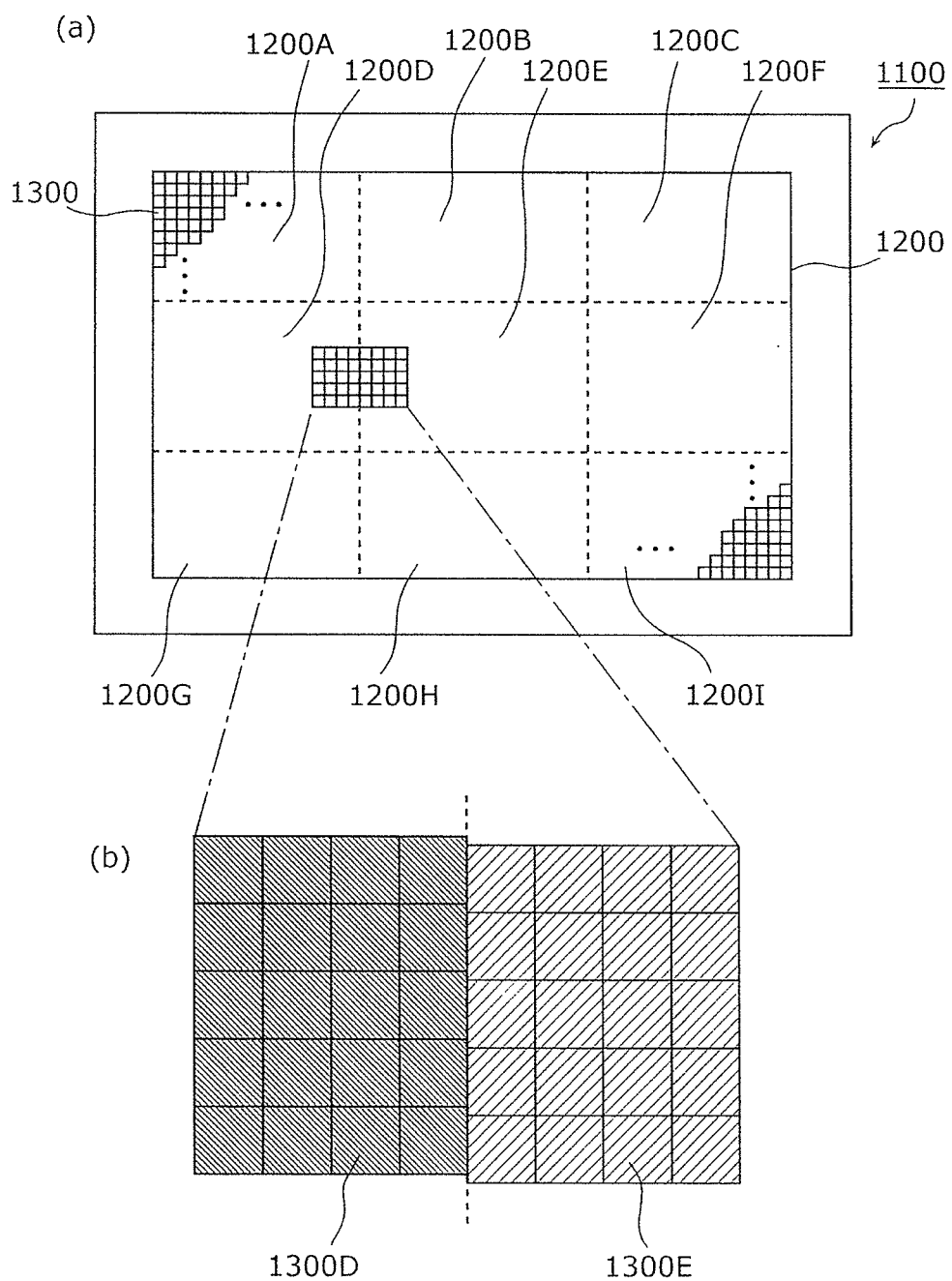
FIGS. 16 (a) and (b) is a diagram for describing a conventional partition wall formation method by division exposure.

The arrangement of the photomasks in the case of forming the partition wall 310 is described below, with reference to FIG. 15. FIG. 15 is a diagram for describing the arrangement relation between the photomasks in the method of manufacturing a display panel according to Embodiment 4 of the present invention.

In this embodiment, the first photomask 40A to the ninth photomask 40I are arranged respectively in correspondence with the division areas 200A to 200I shown in FIG. 13, as shown in FIG. 15. Here, adjacent photomasks are arranged so as to overlap each other, and a first overlapping area 31 and a second overlapping area 32 are set as the overlapping area (overlapping exposure area). The first overlapping area 31 is an area corresponding to a vertically overlapping part of photomasks that are vertically adjacent to each other. The second overlapping area 32 is an area corresponding to a horizontally overlapping part of photomasks that are horizontally adjacent to each other.

Thus, in the first photomask 40A to the ninth photomask 40I, the mask pattern in the edge area corresponding to the first overlapping area 31 and the second overlapping area 32 is the mask pattern in the edge area indicated by "A" or "B", to which at least one of the plurality of openings formed in one pixel is assigned. That is, in the first overlapping area 31 and the second overlapping area 32, each of the plurality of openings in one pixel is patterned only once. In this embodiment, the blue opening pattern 12B which is the mask pattern indicated by "A" and the red opening pattern 22R and the green opening pattern 22G which are the mask pattern indicated by "B" correspond to three openings of RGB of one pixel.

As described above, the method of manufacturing a display panel according to Embodiment 4 of the present invention achieves the same advantageous effects as in Embodiment 1.

The method of manufacturing a display panel according to this embodiment can be realized in the same manner as the method of manufacturing the display panel 100 in Embodiment 1. The whole display area 200 can be exposed by sequentially exposing the nine division areas 200A to 200I using the first photomask 40A to the ninth photomask 40I.

Any of the positive process and the negative process may be employed in the method of manufacturing a display panel according to this embodiment, too.

Though the above describes the case where the mask patterns in the edge area indicated by "A" and "B" in the first photomask 40A to the ninth photomask 40I are the combination of the patterns shown in (c) in FIG. 4 and (c) in FIG. 5, this is not a limit for the present invention. For instance, the combination of the patterns shown in (c) in FIG. 8 and (c) in FIG. 9 or the combination of the patterns shown in (c) in FIG. 11 and (c) in FIG. 12 may be used.

[Variations]

Though the method of manufacturing a display panel according to the present invention has been described by way of the embodiments, the method of manufacturing a display panel according to the present invention is not limited to the above embodiments.

In the above embodiments, the plurality of openings constituting one pixel correspond to three colors red, green, and blue or four colors red, green, blue, and white, and the mask patterns of the first photomask and the second photomask correspond to the openings of these colors. However, the present invention is not limited to this. For example, the plurality of openings and the opening patterns of the first photomask and the second photomask corresponding to the plurality of openings may correspond to other colors. Besides, the color relation (e.g. color order, color identification, color combination) corresponding to the mask pattern of the first photomask and the mask pattern of the second photomask is not limited to the above embodiments.

In this case, too, the photomask overlapping area itself can be made small. When misalignment occurs between the opening formed using the first photomask and the opening formed using the second photomask, such misalignment is within one pixel and causes no significant difference on the human recognition of the display pixel. Pixel misalignment recognized due to misalignment of the photomasks at their boundary can therefore be reduced.

In the above embodiments, the display area is divided into two or nine areas (blocks) to form two or nine division areas. However, the present invention is not limited to this. For example, the display area may be divided into three areas, or divided into nine or more areas, e.g. 16 areas.

Other modifications obtained by applying various changes conceivable by those skilled in the art to the embodiments and any combinations of structural elements and functions in the embodiments are also included in the present invention without departing from the scope of the present invention.

INDUSTRIAL APPLICABILITY

The present invention is useful as a method of manufacturing a display panel such as an organic EL display panel, and can be widely used in, for example, display devices including display panels.

REFERENCE SIGNS LIST 10, 10A, 10B, 40A, 2100 First photomask
11, 21 Main area
11R, 12R, 21R, 22R Red opening pattern
11G, 12G, 21G, 22G Green opening pattern
11B, 12B, 21B, 22B Blue opening pattern
11W, 21W, 22W White opening pattern
12, 22 Edge area
20, 20A, 20B, 40B, 2200 Second photomask
30 Overlapping area
31 First overlapping area
32 Second overlapping area
40C Third photomask
40D Fourth photomask
40E Fifth photomask
40F Sixth photomask
40G Seventh photomask
40H Eighth photomask
40I Ninth photomask
100, 1100 Display panel
200, 1200 Display area
200A, 200B, 200C, 200D, 200E, 200F, 200G, 200H, 200I, 1200A, 1200B, 1200C, 1200D, 1200E, 1200F, 1200G, 1200H, 1200I Division area
300, 1300, 1300D, 1300E, 2300D, 2300E Pixel
310 Partition wall
310R Red opening
310G Green opening
310B Blue opening
311 Partition wall layer
320 Substrate
330 Lower electrode
340 Organic layer
341 Light emitting layer
341R Red light emitting layer
341G Green light emitting layer
341B Blue light emitting layer
350 Upper electrode
360 Sealing resin layer
370 Translucent substrate
2101, 2201 Patterning area
2102, 2202 Light shielding area

The invention claimed is:

1. A method of manufacturing a display panel that includes a light emitting layer separated by a partition wall, the method comprising:
   forming a partition wall layer above a substrate;
   exposing a first area of the partition wall layer using a first photomask that corresponds to a first plurality of openings;
   exposing a second area of the partition wall layer using a second photomask that corresponds to a second plurality of openings, the second area partially overlapping the first area;
   forming the partition wall by removing a part of the partition wall layer corresponding to the first plurality of openings and the second plurality of openings to form the first plurality of openings and the second plurality of openings in the partition wall layer; and
   forming the light emitting layer in each of the first plurality of openings and the second plurality of openings,
   wherein a predetermined number of openings of the first plurality of openings and the second plurality of openings form a unit constituting one pixel,
   the first photomask has a mask pattern in which at least one of the first plurality of openings in an overlapping area corresponds to an opening in the pixel, the overlapping area being an area where the first area and the second area overlap each other, and the second photomask has a mask pattern in which at least one of the second plurality of openings in the overlapping area corresponds to an other opening in the pixel.

2. The method of manufacturing a display panel according to claim 1, wherein each of the predetermined number of openings constituting the pixel corresponds to a different one of a plurality of colors, the plurality of colors include blue, the first photomask has the mask pattern in which the opening in the overlapping area corresponds to an opening in which the light emitting layer for emitting blue light is formed, and the second photomask has the mask pattern in which the other opening in the overlapping area corresponds to an opening in which the light emitting layer for emitting light of a color other than blue, of the plurality of colors, is formed.

3. The method of manufacturing a display panel according to claim 2, wherein the predetermined number of openings constituting the pixel further include an opening corresponding to the light emitting layer for emitting red light and an opening corresponding to the light emitting layer for emitting green light, and the second photomask has the mask pattern in which the other opening in the overlapping area corresponds to the opening in which the light emitting layer for emitting red light is formed and the opening in which the light emitting layer for emitting green light is formed.

4. The method of manufacturing a display panel according to claim 2, wherein the first plurality of openings and the second plurality of openings formed in the partition wall layer are separate for each light emitting layer for emitting light of a different one of the plurality of colors in the pixel.

5. The method of manufacturing a display panel according to claim 1, wherein the first photomask and the second photomask are arranged in a direction perpendicular to an arrangement direction, the arrangement direction being a direction in which the predetermined number of openings constituting the pixel are generally linearly arranged, and openings located in the overlapping area of the first plurality of openings and the second plurality of openings are formed using the first photomask and the second photomask that are arranged in the direction perpendicular to the arrangement direction.

6. The method of manufacturing a display panel according to claim 1, wherein the first photomask and the second photomask are arranged in a direction parallel to an arrangement direction, the arrangement direction being a direction in which the predetermined number of openings constituting the pixel are generally linearly arranged, and openings located in the overlapping area of the first plurality of openings and the second plurality of openings are formed using the first photomask and the second photomask arranged in the direction parallel to the arrangement direction.

7. The method of manufacturing a display panel according to claim 1, wherein the exposure using the first photomask and the second photomask is a positive process, and the part of the partition wall layer corresponding to the first plurality of openings and the second plurality of openings is exposed.

8. The method of manufacturing a display panel according to claim 1, wherein the exposure using the first photomask and the second photomask is a negative process, and a part of the partition wall layer other than the part corresponding to the first plurality of openings and the second plurality of openings is exposed.

9. The method of manufacturing a display panel according to claim 1, wherein the formed light emitting layer is an organic light emitting layer.

10. The method of manufacturing a display panel according to claim 1, wherein a first pixel and a second pixel are formed, each including the first plurality of openings and the second plurality of openings, the first photomask has the mask pattern in which the first plurality of openings in the overlapping area correspond at least to an opening in the first pixel and an opening in the second pixel, the second photomask has the mask pattern in which the second plurality of openings in the overlapping area correspond at least to an other opening in the first pixel and an other opening in the second pixel, and in the forming of the partition wall, the opening in the first pixel and the other opening in the second pixel are each formed as an opening corresponding to the light emitting layer for emitting light of a same color.

11. The method of manufacturing a display panel according to claim 10, wherein each of the predetermined number of openings constituting each of the first pixel and the second pixel corresponds to a different one of a plurality of colors, the plurality of colors include blue, the first photomask has the mask pattern in which the opening in the first pixel in the overlapping area corresponds to an opening in which the light emitting layer for emitting blue light is formed, and the second photomask has the mask pattern in which the other opening in the second pixel in the overlapping area corresponds to an opening in which the light emitting layer for emitting blue light is formed.

* * * * *